United States Patent
Hattori et al.

(10) Patent No.: US 9,241,408 B2
(45) Date of Patent: Jan. 19, 2016

(54) ELECTRONIC COMPONENT

(71) Applicant: Murata Manufacturing Co., Ltd., Nagaokakyo-shi, Kyoto-fu (JP)

(72) Inventors: Kazuo Hattori, Nagaokakyo (JP); Tadateru Yamada, Nagaokakyo (JP); Isamu Fujimoto, Nagaokakyo (JP)

(73) Assignee: Murata Manufacturing Co., Ltd., Kyoto (JP)

( * ) Notice: Subject to any disclaimer, the term of this patent is extended or adjusted under 35 U.S.C. 154(b) by 171 days.

(21) Appl. No.: 13/927,251

(22) Filed: Jun. 26, 2013

(65) Prior Publication Data

US 2013/0284507 A1    Oct. 31, 2013

Related U.S. Application Data

(63) Continuation of application No. PCT/JP2011/080164, filed on Dec. 27, 2011.

(30) Foreign Application Priority Data

Dec. 28, 2010 (JP) ................... 2010-291413

(51) Int. Cl.
*H05K 1/18* (2006.01)
*H01G 2/02* (2006.01)
(Continued)

(52) U.S. Cl.
CPC .................. *H05K 1/18* (2013.01); *H05K 1/181* (2013.01); *H01G 2/02* (2013.01); *H01G 2/06* (2013.01);
(Continued)

(58) Field of Classification Search
CPC ............. H01G 2/02; H01G 2/04; H01G 2/06; H01G 2/065; H05K 1/16; H05K 1/162; H05K 1/11; H05K 1/181

USPC .................... 174/260; 361/760, 807
See application file for complete search history.

(56) References Cited

U.S. PATENT DOCUMENTS 6,369,489 B1    4/2002  Sawai et al.
2003/0056975 A1*  3/2003  Kochanowski ........ H05K 1/111
                                                                  174/250
(Continued)

FOREIGN PATENT DOCUMENTS

JP    62-184727 U    11/1987
JP    62-186462 U    11/1987
(Continued)

OTHER PUBLICATIONS

Machine translation for JP 11-307303.*
(Continued)

*Primary Examiner* — Dion R Ferguson
(74) *Attorney, Agent, or Firm* — Keating & Bennett, LLP

(57) ABSTRACT

In an electronic component, upper surface electrodes are located on one main surface of an insulating substrate of an interposer on which a multilayer ceramic capacitor is mounted. The insulating substrate has substantially the same shape as that of the multilayer ceramic capacitor, viewed from a direction perpendicular or substantially perpendicular to the main surface, and has the multilayer ceramic capacitor mounted thereon so that the length direction of the multilayer ceramic capacitor substantially coincides with the length direction of the insulating substrate. The insulating substrate includes cutouts that include connection electrodes, respectively, and that are located at the four corners viewed from the direction perpendicular or substantially perpendicular to the main surface. The upper surface electrodes on the one main surface are connected via the connection electrodes to lower surface electrodes, respectively, that are located on the other main surface and are connected to a circuit board.

20 Claims, 15 Drawing Sheets

(51) Int. Cl.
*H01G 2/06* (2006.01)
*H05K 3/34* (2006.01)

(52) U.S. Cl.
CPC .... *H05K 3/3442* (2013.01); *H05K 2201/09145* (2013.01); *H05K 2201/10015* (2013.01); *H05K 2201/10378* (2013.01); *H05K 2201/2045* (2013.01)

(56) References Cited

U.S. PATENT DOCUMENTS

| | | | |
|---|---|---|---|
| 2004/0066589 | A1 | 4/2004 | Togashi et al. |
| 2007/0145575 | A1 | 6/2007 | Mori et al. |
| 2007/0158101 | A1* | 7/2007 | Chikagawa et al. .......... 174/260 |
| 2008/0003846 | A1* | 1/2008 | Miyagawa ...................... 439/71 |
| 2010/0123995 | A1 | 5/2010 | Otsuka et al. |
| 2011/0127680 | A1 | 6/2011 | Masuda et al. |
| 2012/0125674 | A1 | 5/2012 | Miyahara et al. |

FOREIGN PATENT DOCUMENTS

| | | | |
|---|---|---|---|
| JP | 63-187320 U | 11/1988 | |
| JP | 1-155668 U | 10/1989 | |
| JP | 6-77631 A | 3/1994 | |
| JP | 6-215982 A | 8/1994 | |
| JP | 07-037747 A | 2/1995 | |
| JP | 07-111380 A | 4/1995 | |
| JP | 08-055752 A | 2/1996 | |
| JP | 8-222478 A | 8/1996 | |
| JP | 11-288978 A | 10/1999 | |
| JP | 11-307303 A | 11/1999 | |
| JP | 2000-12367 A | 1/2000 | |
| JP | 3061031 B2 | 7/2000 | |
| JP | 2000-323959 A | 11/2000 | |
| JP | 2004-134430 A | 4/2004 | |
| JP | 2004-335657 A | 11/2004 | |
| JP | 2005-130341 A | 5/2005 | |
| JP | 2006-185958 A | 7/2006 | |
| JP | 2006-186167 A | 7/2006 | |
| JP | 2009-283490 A | 12/2009 | |
| JP | 2010-123614 A | 6/2010 | |
| JP | 2010-272591 A | 12/2010 | |
| JP | 2011-009507 A | 1/2011 | |
| JP | 2011-014589 A | 1/2011 | |
| WO | 2005/072033 A1 | 8/2005 | |
| WO | 2009/028463 A1 | 3/2009 | |
| WO | 2010/134335 A1 | 11/2010 | |

OTHER PUBLICATIONS

Machine translation for JP 11-307303, originally published in Japanese in Nov. 1999, originally made part of the record on Mar. 18, 2015.*
Official Communication issued in corresponding Japanese Patent Application No. 2012-550961, mailed on May 28, 2013.
Official Communication issued in International Patent Application No. PCT/JP2011/080164, mailed on Apr. 10, 2012.
Official Communication issued in corresponding Japanese Patent Application No. 2013-192842, mailed on May 27, 2014.
Official Communication issued in corresponding Chinese Patent Application No. 201180063327.8, mailed on Jun. 18, 2015.

* cited by examiner

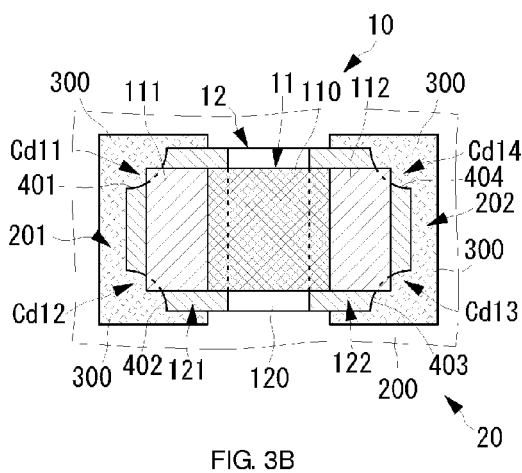
FIG. 3A
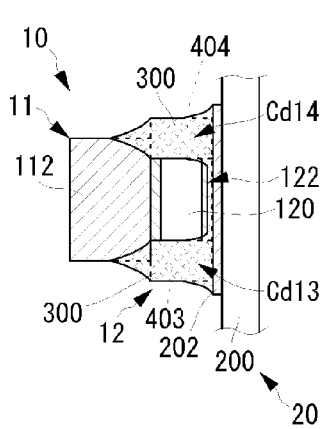
FIG. 3C
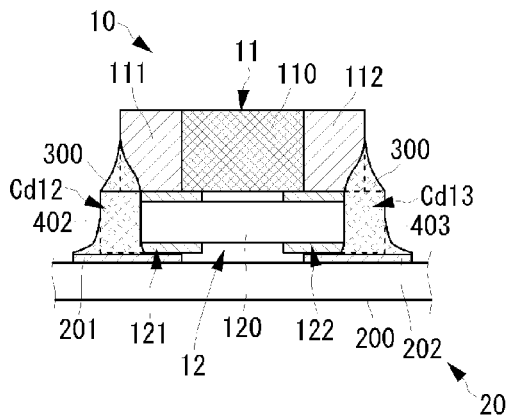
FIG. 3B
FIG. 4
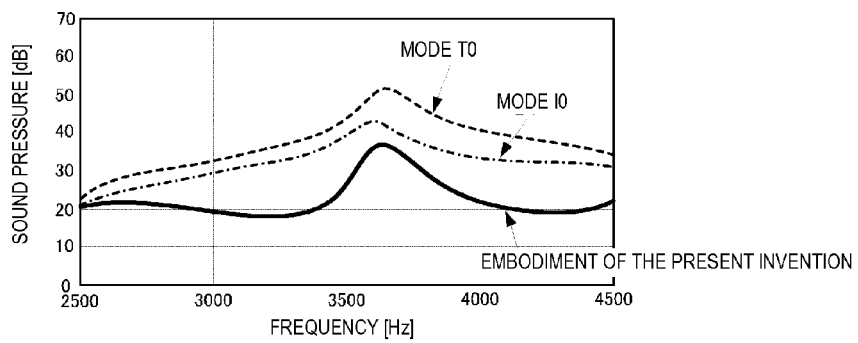
MODE T0: NO INTERPOSER (TERMINAL IS SOLDERED)
MODE I0: WITH INTERPOSER (TERMINAL IS SOLDERED OVER THE ENTIRE SURFACE)
EMBODIMENT OF THE PRESENT INVENTION: WITH INTERPOSER (ONLY RIDGES OF TERMINAL ARE SOLDERED)

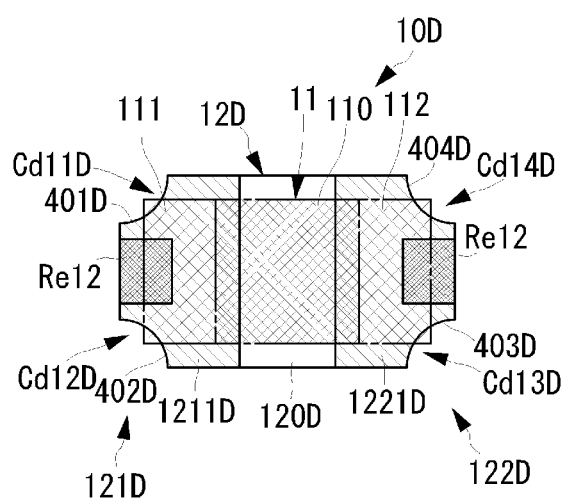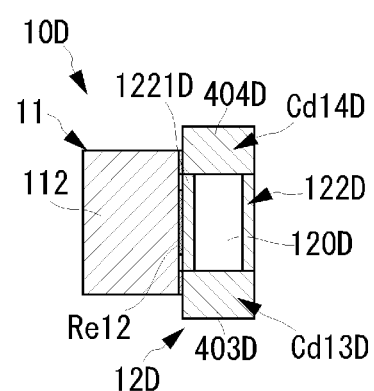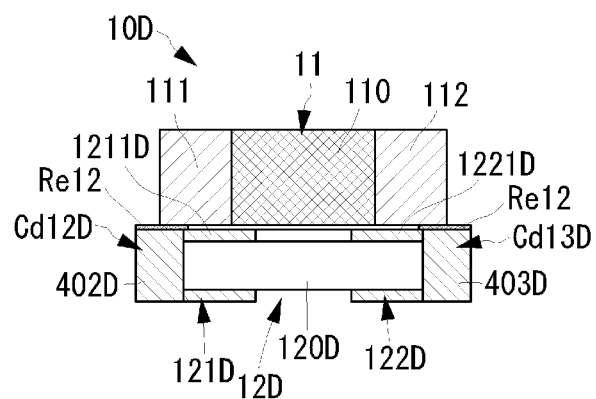

ELECTRONIC COMPONENT

BACKGROUND OF THE INVENTION

1. Field of the Invention

The present invention relates to an electronic component that is used to mount a chip component, such as a multilayer ceramic capacitor, on a circuit board and that includes an interposer.

2. Description of the Related Art

Many chip components, particularly, many compact multilayer ceramic capacitors are currently used in mobile terminals including cellular phones. The multilayer ceramic capacitors are each composed of a rectangular component body that functions as a capacitor and outer electrodes formed at both opposing ends of the component body.

In general, as indicated in Japanese Unexamined Patent Application Publication No. 8-55752, the multilayer ceramic capacitor has heretofore been electrically and physically connected to a circuit board of a mobile terminal by directly placing and holding the outer electrodes on a mounting land on the circuit board and joining the mounting land to the outer electrodes with bond, such as solder.

Mechanical strain may occur in the multilayer ceramic capacitor due to a variation in voltage occurring in an electronic circuit including the multilayer ceramic capacitor. If the strain occurs, the strain is transmitted to the circuit board to cause the circuit board to vibrate. The vibration of the circuit board may cause a vibration sound which a person hears with his/her ears.

In order to resolve the above problems, for example, Japanese Unexamined Patent Application Publication No. 7-111380 and Japanese Unexamined Patent Application Publication No. 2004-134430 describe technologies not to directly mount the multilayer ceramic capacitor on the mounting land. An interposer formed of an insulating substrate is used in each of Japanese Unexamined Patent Application Publication No. 7-111380 and Japanese Unexamined Patent Application Publication No. 2004-134430. When the interposer is used, the multilayer ceramic capacitor is joined to an upper surface electrode of the interposer and a lower surface electrode of the interposer is joined to a mounting electrode of the circuit board. The upper surface electrode is connected to the lower surface electrode via holes that pass through the interposer.

However, in the structure in Japanese Unexamined Patent Application Publication No. 7-111380, after a component substrate is superposed on a supporting substrate and the component substrate is joined to the supporting substrate with bond, a solder mask is formed on only side surfaces of the component substrate to prevent the solder in the mounting on the circuit board from rising to the component substrate. In other words, since the solder in the mounting does not adhere to the outer electrodes on the component substrate although the solder rises to the side surfaces of the supporting substrate, the component substrate is not strongly restrained. As a result, even if the component substrate vibrates, the vibration is inhibited from being transmitted to the circuit board or the like through the supporting substrate. However, it is necessary to form the solder mask only on the side surfaces of the component substrate after the component substrate is joined to the supporting substrate with the bond, so that the manufacturing cost may possibly be increased in this structure.

Japanese Unexamined Patent Application Publication No. 2004-134430 uses a special structure in which the direction in which the lower surface electrode is arranged intersects with the direction in which the upper surface electrode is arranged in the interposer, that is, the direction in which the outer electrodes of the multilayer ceramic capacitor are arranged intersects with the direction in which an electrode for mounting the interposer on the circuit board is arranged. Consequently, the interposer is increased in size and the shapes of the electrodes of the interposer are made complicated, which causes further increases in cost.

SUMMARY OF THE INVENTION

Preferred embodiments of the present invention provide an electronic component that is easily structurally designed and mounted, that has mounting strength and electrical characteristics similar to those of common mounting structures in the related art, and that is capable of more effectively reducing or preventing the occurrence of the vibration sound.

A preferred embodiment of the present invention provides an electronic component including a base plate that includes a flat-plate-shaped insulating substrate, a first upper surface electrode and a second upper surface electrode located on one main surface of the insulating substrate, and a first lower surface electrode and a second lower surface electrode located on the other main surface of the insulating substrate, and a chip component that includes a first outer electrode and a second outer electrode located on both ends in a length direction of a main body. The first outer electrode opposes the second outer electrode. The first outer electrode is mounted on the first upper surface electrode. The second outer electrode is mounted on the second upper surface electrode. In the electronic component, the base plate includes a plurality of connection electrodes that are located on end surfaces perpendicular or substantially perpendicular to the one main surface and the other main surface, that connects the first upper surface electrode to the first lower surface electrode, and that connects the second upper surface electrode to the second lower surface electrode. The first upper surface electrode is separated from the first lower surface electrode and the second upper surface electrode is separated from the second lower surface electrode at substantially the center in a width direction perpendicular or substantially perpendicular to the length direction of the main body of the chip component.

In the above structure, a bonding material, such as solder (the solder is typically exemplified below), is preferably used in bonding of the electronic component including the chip component and the base plate on a circuit board.

The soldering is performed so that solder fillet is formed at least from mounting lands located on the circuit board to the connection electrodes of the base plate in the above case. The formation of the fillet in the above manner is very effective because the formation of the fillet in the above manner prevents float in the mounting of the electronic component, ensures bonding strength, and enables secure soldering to be visually confirmed. The solder may rise to the electronic component depending on the amount of solder that is supplied. If the solder spreads to central portions of the end surfaces of the chip component via the insulating substrate, both ends of the chip component is strongly restrained by the solder to cause vibration of the chip component to be easily transmitted to the circuit board via the insulating substrate to possibly cause a vibration sound. However, with the structure according to a preferred embodiment of the present invention, even if the solder rises from the electronic component to reach the first and second outer electrodes of the chip component, the solder most adheres to the corners at the bottom surface side of the chip component. For example, the spread of the solder to ridge line portions extending from the corners in the direction perpendicular or substantially perpendicular to the main surface and the adherence of the solder around the centers of the outer electrodes are limited. Accordingly, it is possible to significantly reduce or prevent the occurrence of the vibration sound.

In addition, since the electronic component has the structure in which the flat-plate-shaped insulating substrate is only added to the chip component, it is possible to achieve a low profile and the bonding strength similar to that in the related art. Since a special structure is not required, it is possible to easily exchange the structural elements and to easily change the design.

An electronic component according to a preferred embodiment of the present invention preferably has the following structure. The insulating substrate preferably includes the first upper surface electrode and the first lower surface electrode provided at a position corresponding to the first outer electrode of the chip component and preferably includes the second upper surface electrode and the second lower surface electrode provided at a position corresponding to the second outer electrode of the chip component. The plurality of connection electrodes are preferably located at four corners of the insulating substrate.

The direction in which the first and second outer electrodes located on both ends of the chip component are arranged coincides or substantially coincides with the direction in which the first and second upper surface electrodes and the first and second lower surface electrodes of the electronic component are arranged, and the connection electrodes are located at the four corners of the insulating substrate in the above structure. Accordingly, the connection electrodes are closest to the ridge line portions of the first and second outer electrodes. The solder that has risen to the first and second upper surface electrodes adheres to portions near the ridge line portions.

In an electronic component according to a preferred embodiment of the present invention, cutouts are preferably provided at the four corners of the insulating substrate, and the connection electrodes are preferably located on inner walls of the corresponding cutouts.

With this structure, the distance between the connection electrodes and the end portions of the ridge line portions of the first and second outer electrodes toward the first and second upper surface electrodes is reduced.

In an electronic component according to a preferred embodiment of the present invention, when the chip component is mounted on the insulating substrate, at least one portion of each of the cutouts preferably exists in an area including an outline of the chip component, viewed from a direction perpendicular or substantially perpendicular to the one main surface and the other main surface.

The at least one portion of each of the cutouts is arranged in the area of the outline shape of the chip component in the above structure. Accordingly, even if the solder rises along the connection electrodes located on the cutouts, the solder stops near the ridge line portions of the outer electrodes of the chip component and is prevented from spreading over the upper surface electrodes of the insulating substrate and, furthermore, over both end surfaces in the length direction of the chip component. In addition, since the connection electrodes exist at substantially the same positions as the ridge line portions of the outer electrodes of the chip component, it is possible to simply use the lands on the circuit board, which are used in the direct mounting of the chip component on the circuit board.

In an electronic component according to a preferred embodiment of the present invention, the cutouts each preferably are arc shaped and curved toward a center of the insulating substrate, viewed from the direction perpendicular or substantially perpendicular to the one main surface and the other main surface.

With the above structure, in the outline of the substrate, a distance of the concave portion toward the center is longer than lengths of the cutout along the length direction, i.e., the direction in which the first and second upper surface electrodes extend, and in the width direction perpendicular or substantially perpendicular to the length direction. Accordingly, the distance between the connection electrodes and the end portions of the ridge line portions of the first and second outer electrodes toward the first and second upper surface electrodes is made much shorter.

In an electronic component according to a preferred embodiment of the present invention, when the chip component is mounted on the insulating substrate, the insulating substrate may have an outline shape smaller than the outline of the chip component, viewed from the direction perpendicular or substantially perpendicular to the one main surface and the other main surface.

Since the insulating substrate enters the inside of the outline of the chip component in the above structure, the solder that has risen along the connection electrodes is blocked at the side of the bottom surface of the ridge line portions of the first and second outer electrodes of the chip component. Accordingly, it is possible to further reduce or prevent adherence of the solder to portions near the centers of the first and second outer electrodes. In addition, since the electronic component is bonded to the circuit board at the positions of the ridge line portions of the first and second outer electrodes, viewed from the direction perpendicular or substantially perpendicular to the main surface of the insulating substrate, it is possible to mount the electronic component with mounting lands having the same or substantially the same shape as that of the mounting lands with which only a chip component is directly mounted on the circuit board. Accordingly, it is possible to mount the electronic component without an increase in two-dimensional size.

In an electronic component according to a preferred embodiment of the present invention, the insulating substrate may directly oppose the first outer electrode and the second outer electrode in certain ranges including positions where perpendicular portions that are extended down from the centers of end portions where the first outer electrode and the second outer electrode of the chip component are arranged relative to the substrate so as to intersect at right angles with the substrate.

In the above structure, the insulating substrate directly opposes the first outer electrode and the second outer electrode in the certain ranges including the positions where the perpendicular portions that are extended down from the centers of the end portions where the first outer electrode and the second outer electrode of the chip component are arranged relative to the substrate intersect at right angles with the substrate. Accordingly, it is possible to prevent the solder that has risen from reaching the centers of the end surfaces of the first and second outer electrodes. In other words, the formation of electrode non-formation portions within the certain ranges of the insulating substrate allows the solder that has risen to be prevented from reaching the centers of the end surfaces of the first and second outer electrodes.

In an electronic component according to a preferred embodiment of the present invention, a resist film may be provided in certain ranges including positions where perpendicular portions that are extended down from the centers of end portions where the first outer electrode and the second outer electrode of the chip component are located relative to the first upper surface electrode and the second upper surface electrode intersect at right angles with the base plate on surfaces where the chip component is mounted of the first upper surface electrode and the second upper surface electrode.

With the above structure, it is possible to prevent the solder that has risen from reaching the centers of the end surfaces of the first and second outer electrodes due to the resist film.

According to another preferred embodiment of the present invention, an electronic component includes a base plate that includes a flat-plate-shaped insulating substrate, a first upper surface electrode and a second upper surface electrode located on one main surface of the insulating substrate, and a first lower surface electrode and a second lower surface electrode located on the other main surface of the insulating substrate, and a chip component that includes a first outer electrode and a second outer electrode located on both ends in a length direction of a main body. The first outer electrode opposes the second outer electrode. The first outer electrode is mounted on the first upper surface electrode. The second outer electrode is mounted on the second upper surface electrode. The electronic component may have the following structure. In the electronic component, the base plate includes a plurality of connection electrodes that are located on end surfaces perpendicular or substantially perpendicular to the one main surface and the other main surface, that connects the first upper surface electrode to the first lower surface electrode, and that connects the second upper surface electrode to the second lower surface electrode. A contact limiting unit is provided with the first upper surface electrode and the second upper surface electrode such that certain ranges including positions where perpendicular portions that are extended down from the centers of end surfaces of the first outer electrode and the second outer electrode to the first upper surface electrode and the second upper surface electrode intersect at right angles with the base plate, are not in contact with the first upper surface electrode and the second upper surface electrode.

With the above structure, even if the solder rises from the electronic component to reach the first and second outer electrodes of the chip component in the mounting of the electronic component on the circuit board with the solder, the contact limiting unit prevents the solder from adhering to portions near the centers of the first and second outer electrodes. Accordingly, it is possible to significantly reduce or prevent the occurrence of the vibration sound described above.

An electronic component according to a preferred embodiment of the present invention preferably has the following structure. The insulating substrate preferably includes the first upper surface electrode and the first lower surface electrode provided at a position corresponding to the first outer electrode of the chip component and preferably includes the second upper surface electrode and the second lower surface electrode provided at a position corresponding to the second outer electrode of the chip component. The contact limiting unit is preferably an open area provided in the first upper surface electrode and the second upper surface electrode.

In the above structure, no electrode is provided at the positions of the perpendicular portions that are extended down from the centers of the first and second outer electrodes to the first and second upper surface electrodes (at the positions immediately below the centers). Accordingly, it is possible to significantly reduce or prevent adherence of the solder to the positions immediately below the centers.

An electronic component according to a preferred embodiment of the present invention preferably has the following structure. The insulating substrate preferably includes the first upper surface electrode and the first lower surface electrode provided at a position corresponding to the first outer electrode of the chip component and preferably includes the second upper surface electrode and the second lower surface electrode provided at a position corresponding to the second outer electrode of the chip component. The contact limiting unit is preferably a resist film located on the first upper surface electrode and the second upper surface electrode.

In the above structure, the resist film is disposed between the first and second outer electrodes and the first and second upper surface electrodes at the positions immediately below the centers of the first and second outer electrodes. Accordingly, it is possible to significantly reduce or prevent adherence of the solder to the positions immediately below the centers.

In an electronic component according to a preferred embodiment of the present invention, the connection electrodes may be each located at substantially the center in a width direction perpendicular or substantially perpendicular to the length direction of the main body of the chip component.

In an electronic component according to a preferred embodiment of the present invention, the connection electrodes are preferably each located on an inner wall of a cutout provided on an end surface portion of the insulating substrate.

In an electronic component according to a preferred embodiment of the present invention, the cutouts preferably each are arc shaped and curved toward a center of the insulating substrate, viewed from a direction perpendicular or substantially perpendicular to the one main surface and the other main surface.

With the above structure, in the outline of the substrate, the distance from the concave portion toward the center of the insulating substrate can be made longer than the lengths of the cutout in the length direction, that is, the direction in which the first and second upper surface electrodes are arranged, and in the width direction perpendicular or substantially perpendicular to the length direction.

According to another preferred embodiment of the present invention, an electronic component includes a base plate that includes a flat-plate-shaped insulating substrate, a first upper surface electrode and a second upper surface electrode located on one main surface of the insulating substrate, and a first lower surface electrode and a second lower surface electrode located on the other main surface of the insulating substrate, and a chip component that includes a first outer electrode and a second outer electrode located on both ends in a length direction of a main body. The first outer electrode opposes the second outer electrode. The first outer electrode is mounted on the first upper surface electrode. The second outer electrode is mounted on the second upper surface electrode. The electronic component may have the following structure. In the electronic component, connection electrodes are each provided on an inner wall defining a cutout having a shape that is concave from an end surface of the insulating substrate. A limiting unit with which the cutouts are covered in a plan view of the insulating substrate is located at the side of the first upper surface electrode and at the side of the second upper surface electrode of the cutout.

In the above structure, the bonding material that rises along the connection electrodes of the insulating substrate from the circuit board is blocked by the limiting unit and does not reach the first and second upper surface electrodes. Accordingly, it is possible to prevent the bonding material from unnecessarily adhering to the first and second outer electrodes of the chip component.

In an electronic component according to a preferred embodiment of the present invention, a bonding limiting unit may be provided in a certain range including a center of an end surface on which the first outer electrode and the second outer electrode of the chip component are located.

In the above structure, the structure to significantly reduce or prevent adherence of the solder to the central portions of the end surfaces of the chip component is provided also for the chip component. Accordingly, it is possible to more reliably reduce or prevent the adherence of the solder to the central portions of the end surfaces of the chip component, in addition to the achievement of the structural features for the insulating substrate.

In the electronic component according to a preferred embodiment of the present invention, the bonding limiting unit may be arranged over the entire end surface.

In the above structure, for example, the first and second outer electrodes are preferably provided only on the bottom surface of the chip component (the surface on which the chip component is bonded to the insulating substrate). Accordingly, it is possible to more reliably reduce and prevent adherence of the solder to the central portions of the end surfaces of the chip component.

In an electronic component according to a preferred embodiment of the present invention, the chip component is preferably a multilayer ceramic capacitor, for example.

The mounting of the chip component, such as the multilayer ceramic capacitor, on the circuit board by using the electronic component indicated in various preferred embodiments of the present invention allows the occurrence of the vibration sound to be significantly reduced or prevented. In addition, the structure is simple to enable a reduction in size and it is easy to mount the chip component on the circuit board. Furthermore, it is possible to ensure mounting strength and electrical characteristics similar to those of common mounting structures in the related art.

The above and other elements, features, steps, characteristics and advantages of the present invention will become more apparent from the following detailed description of the preferred embodiments with reference to the attached drawings.

BRIEF DESCRIPTION OF THE DRAWINGS

FIGS. 3A-3C are orthographic views indicating a state in which the electronic component 10 according to the first preferred embodiment is mounted on a circuit board 20.

FIG. 4 is a graph indicating the relationship between a sound pressure level and frequency characteristics in the structure of the first preferred embodiment and in structures in the related art.

FIGS. 9A-9C are orthographic views illustrating an exemplary structure of an electronic component 10D including an interposer 12D according to a fifth preferred embodiment of the present invention.

DETAILED DESCRIPTION OF THE PREFERRED EMBODIMENTS

Figure 1A:
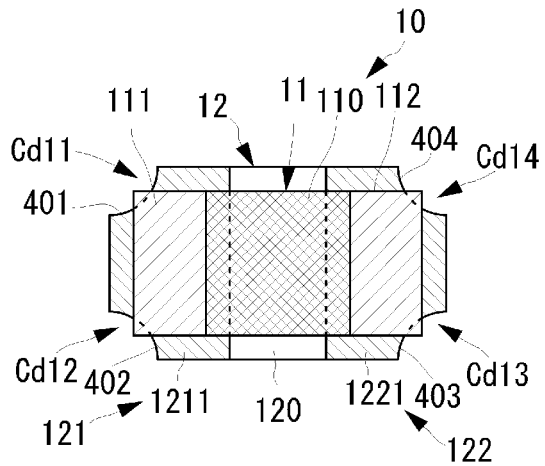
FIGS. 1A-1D include orthographic views illustrating an exemplary structure of an electronic component 10 including an interposer 12 according to a first preferred embodiment of the present invention and a diagram indicating the relationship between the shape of the interposer 12 and that of a multilayer ceramic capacitor 11.
Figure 1C:
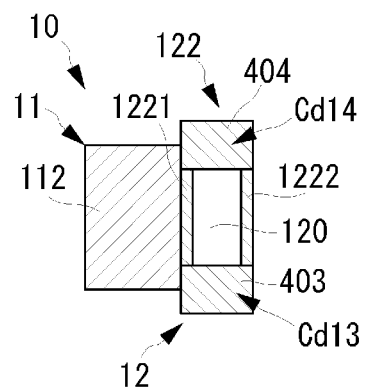
Figure 1B:
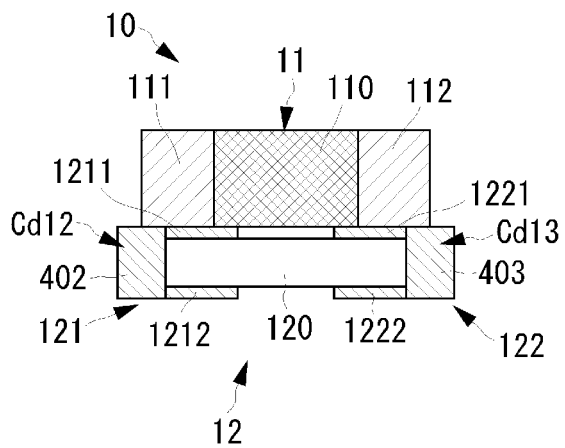
Figure 1D:
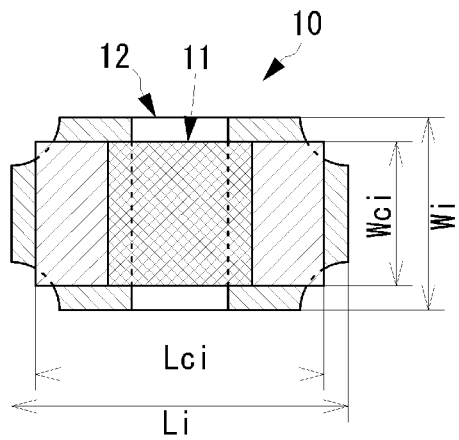
Figure 2A:
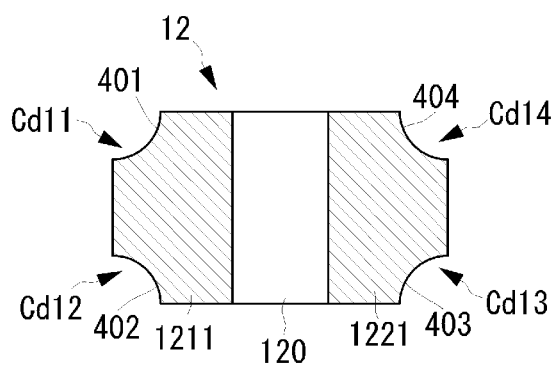
FIGS. 2A-2C are orthographic views of the interposer 12 according to the first preferred embodiment of the present invention.
Figure 2C:
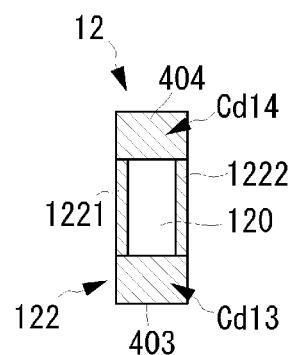
Figure 2B:
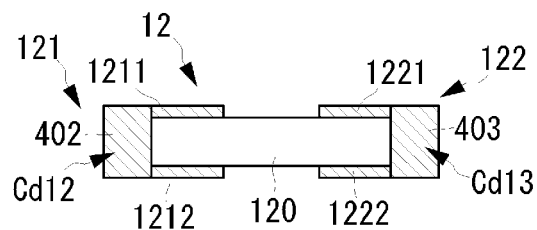

An electronic component including an interposer according to a first preferred embodiment of the present invention will herein be described with reference to the attached drawings. FIGS. 1A-1D include orthographic views illustrating an exemplary structure of an electronic component 10 including an interposer 12 according to the present preferred embodiment and a diagram indicating the relationship between the shape of the interposer 12 and that of a multilayer ceramic capacitor 11. FIGS. 2A-2C are orthographic views of the interposer 12 according to the present preferred embodiment. FIGS. 3A-3C are orthographic views indicating a state in which the electronic component 10 according to the present preferred embodiment is mounted on a circuit board 20. In the orthographic views illustrated in FIGS. 1A-1C, FIGS. 2A-2C, and FIGS. 3A-3C, FIG. 1A, FIG. 2A, and FIG. 3A are plan views; FIG. 1B, FIG. 2B, and FIG. 3B are side views in the length direction; and FIG. 1C, FIG. 2C and FIG. 3C are side views in the width direction. The plan view is a diagram of the interposer 12 or the electronic component 10, viewed from an upper surface side. The side view in the length direction is a diagram of the interposer 12 or the electronic component 10, viewed from a direction that is perpendicular or substantially perpendicular to a direction in which intermediate connection electrodes (hereinafter referred to as "IP electrodes") 121 and 122 of the interposer 12 are arranged and that is parallel or substantially parallel to a main surface of the interposer 12 (a surface on which the multilayer ceramic capacitor 11 is mounted). The side view in the width direction is a diagram of the interposer 12 or the electronic component 10, viewed from a direction that is parallel or substantially parallel to the direction in which the IP electrodes 121 and 122 of the interposer 12 are arranged and that is parallel or substantially parallel to the main surface of the interposer 12 (the surface on which the multilayer ceramic capacitor 11 is mounted). Although the views are hatched, the hatching is added to facilitate identification of the respective parts and the hatching is not used to indicate cross-sectional views. The same applies to the drawings described below and, when the drawings are cross-sectional views, it is indicated that the drawings are the cross-sectional views in each case.

The multilayer ceramic capacitor 11 corresponds to a "chip component" according to a preferred embodiment of the present invention and includes a component body 110. The component body 110 includes dielectric layers and inner electrode layers of a predetermined number that are stacked on each other and fired. The multilayer ceramic capacitor 11 includes an outer electrode 111 (corresponding to a "first outer electrode") located at one end in the length direction of the component body 110 (the lateral direction of the drawing illustrated in FIG. 1A) and an outer electrode 112 (corresponding to a "second outer electrode") formed at the other opposing end in the length direction of the component body 110. The outer electrodes 111 and 112 are each formed preferably by burning certain conductive paste, and the surface of each of the outer electrodes 111 and 112 is plated with tin. A direction in which the outer electrodes 111 and 112 are arranged is hereinafter referred to as the length direction of the multilayer ceramic capacitor 11, and a direction that is perpendicular or substantially perpendicular to the length direction and that is parallel or substantially parallel to the mounting surface on which the multilayer ceramic capacitor 11 is mounted is hereinafter referred to as the width direction of the multilayer ceramic capacitor 11.

The outer electrodes 111 and 112 are formed so as to spread not only on both ends in the length direction of the component body 110 but also from the both ends in the length direction to both ends in the width direction, the top surface, and the bottom surface.

The multilayer ceramic capacitor 11 formed in the above manner preferably has an approximate length and width of, for example, 3.2 mm×1.6 mm, 2.0 mm×1.25 mm, 1.6 mm×0.8 mm, 1.0 mm×0.5 mm, or 0.6 mm×0.3 mm.

The interposer 12 corresponds to a "base plate" and includes an insulating substrate 120, as illustrated in FIG. 2. The insulating substrate 120 preferably has a thickness of, for example, from about 0.5 mm to about 1.0 mm and is made of insulating resin. The insulating substrate 120 has a rectangular or substantially rectangular shape similar to the shape of the multilayer ceramic capacitor 11, viewed from a direction perpendicular or substantially perpendicular to the main surface. The insulating substrate 120 includes cutouts Cd11, Cd12, Cd13, and Cd14 having a shape in which the four corners of the insulating substrate 120 are concaved toward the center side of the main surface, viewed from the direction perpendicular or substantially perpendicular to the main surface. The cutouts Cd11, Cd12, Cd13, and Cd14 have a shape resulting from cutout of a predetermined radius R around each corner of the rectangular insulating substrate 120, viewed from the direction perpendicular or substantially perpendicular to the main surface. These cutouts Cd11, Cd12, Cd13, and Cd14 are easily formed by forming a cylindrical through hole at a point where adjacent four insulating substrates 120 are in contact with each other in separation of the individual insulating substrates 120 from a base substrate in which multiple insulating substrates 120 are arranged and cutting and separating the base substrate through the portions where the through holes are formed.

The insulating substrate 120 has a structure such that the length and the width of the insulating substrate 120 in a plan view are slightly larger than the length and the width of the multilayer ceramic capacitor 11 to be mounted. Specifically, as illustrated in FIG. 1D, $Li \cong Lci$ and $Li > Lci$, wherein Lci denotes the length of the multilayer ceramic capacitor 11 and Li denotes the length of the insulating substrate 120 (the interposer 12). Similarly, $Wi \cong Wci$ and $Wi > Wci$, wherein Wci denotes the width of the multilayer ceramic capacitor 11 and Wi denotes the width of the insulating substrate 120 (the interposer 12).

The insulating substrate 120 has a structure such that central portions of the curved surfaces defining the cutouts Cd11, Cd12, Cd13, and Cd14 are within a range of the outline of the multilayer ceramic capacitor 11 that is mounted.

Upper surface electrodes 1211 and 1221 are provided on one main surface at a side at which the multilayer ceramic capacitor 11 is mounted of the insulating substrate 120. The upper surface electrodes 1211 and 1221 are arranged so as to be separated from each other. The upper surface electrode 1211 corresponds to a "first upper surface electrode" and the upper surface electrode 1221 corresponds to a "second upper surface electrode".

The upper surface electrode 1211 is located in an area at one end in the length direction of the one main surface. The size of the upper surface electrode 1211 in the length direction is set so that an area where the bottom surface of the outer electrode 111 of the multilayer ceramic capacitor 11 is in contact with the upper surface electrode 1211 is included when the multilayer ceramic capacitor 11 is mounted on the one main surface of the interposer 12 (the insulating substrate 120) so that the length direction of the multilayer ceramic capacitor 11 substantially coincides with the length direction of the interposer 12. The upper surface electrode 1211 is arranged over the entire width of the insulating substrate 120 in the width direction.

The upper surface electrode 1221 is provided in an area at the other end in the length direction of the one main surface. The size of the upper surface electrode 1221 in the length direction is set so that an area where the bottom surface of the outer electrode 112 of the multilayer ceramic capacitor 11 is in contact with the upper surface electrode 1221 is included when the multilayer ceramic capacitor 11 is mounted on the one main surface of the interposer 12 (the insulating substrate 120) so that the length direction of the multilayer ceramic capacitor 11 substantially coincides with the length direction of the interposer 12. The upper surface electrode 1221 is arranged over the entire width of the insulating substrate 120 in the width direction.

Lower surface electrodes 1212 and 1222 are provided on the other main surface of the insulating substrate 120, opposite to the side at which the multilayer ceramic capacitor 11 is mounted. The lower surface electrodes 1212 and 1222 are arranged so as to be separated from each other. The lower surface electrode 1212 corresponds to a "first lower surface electrode" and the lower surface electrode 1222 corresponds to a "second lower surface electrode".

The lower surface electrode 1212 preferably has a shape substantially opposing the upper surface electrode 1211 in an area at one end in the length direction of the other main surface of the insulating substrate 120. The lower surface electrode 1222 preferably has a shape substantially opposing the upper surface electrode 1221 in an area at the other end in the length direction of the other main surface of the insulating substrate 120. The lower surface electrodes 1212 and 1222 are more preferably disposed at positions overlapped on the outer electrodes 111 and 112 of the multilayer ceramic capacitor 11 to be mounted, viewed from the direction perpendicular or substantially perpendicular to the main surface.

The upper surface electrode 1211 and the lower surface electrode 1212 located at the one end in the length direction of the insulating substrate 120 are connected with connection electrodes 401 and 402 provided on the walls of the cutouts Cd11 and Cd12, respectively. The upper surface electrode 1211, the lower surface electrode 1212, the connection electrode 401 of the cutout Cd11, and the connection electrode 402 of the cutout Cd12 form the IP electrode 121 described above.

The upper surface electrode 1221 and the lower surface electrode 1222 located at the other end in the length direction of the insulating substrate 120 are connected with connection electrodes 403 and 404 provided on the walls of the cutouts Cd13 and Cd14, respectively. The upper surface electrode 1221, the lower surface electrode 1222, the connection electrode 403 of the cutout Cd13, and the connection electrode 404 of the cutout Cd14 define the IP electrode 122 described above.

When the multilayer ceramic capacitor 11 is mounted on the interposer 12 described above, the upper surface electrode 1211 of the IP electrode 121 of the interposer 12 is electrically and mechanically connected to the outer electrode 111 of the multilayer ceramic capacitor 11 by re-melting of the tin plating on the outer electrode 111. The upper surface electrode 1221 of the IP electrode 122 of the interposer 12 is electrically and mechanically connected to the outer electrode 112 of the multilayer ceramic capacitor 11 by the re-melting of the tin plating on the outer electrode 112. When the IP electrodes 121 and 122 are plated with tin in advance, the tin plating on the IP electrodes 121 and 122 are also used for the connection. The use of the tin plating in the above manner allows the bonding with a minimum amount to minimum the amount of restraint near the centers of the outer electrodes of the chip component. The electronic component 10 is preferably formed in the above manner. The multilayer ceramic capacitor 11 may be bonded to the interposer 12 by using solder of substantially the same amount as that of the tin plating, without using the tin plating on the outer electrodes 111 and 112 and the tin plating on the interposer 12.

The electronic component 10 is mounted on a circuit board 20 in a manner illustrated in FIGS. 3A-3C. Specifically, the electronic component 10 is mounted on the circuit board 20 so that the lower surface electrode 1212 of the IP electrode 121 of the interposer 12 is connected to a mounting land 201 of the circuit board 20 and the lower surface electrode 1222 of the IP electrode 122 of the interposer 12 is connected to a mounting land 202 of the circuit board 20. The IP electrodes 121 and 122 of the interposer 12 are connected to the mounting lands 201 and 202 of the circuit board 20 with solder 300.

The soldering with the solder 300 is performed so that solder fillet is formed at least from the mounting lands 201 and 202 of the circuit board 20 to the connection electrodes 401 to 404 of the interposer 12. The formation of the fillet in the above manner is very effective because the formation of the fillet in the above manner prevents float in the mounting of the electronic component 10, ensures bonding strength, and allows the secure soldering to be visually confirmed.

A material other than the solder 300 may be used as long as the bonding material has wetness and electrical conductivity.

If a large amount of solder is supplied in the soldering with the solder 300, the solder 300 may rise to the upper surface side of the interposer 12 via the connection electrodes 401 to 404, in addition of the formation of the solder fillet in the connection electrodes 401 to 404 of the IP electrodes 121 and 122.

However, the connection electrodes 401 to 404 are preferably provided only at the four corners of the interposer 12 in the structure of the present preferred embodiment. The cutouts Cd11, Cd12, Cd13, and Cd14 where the connection electrodes 401 to 404 are provided coincide with the four corners of the multilayer ceramic capacitor 11, viewed from the direction perpendicular or substantially perpendicular to the main surface, that is, the positions of four ridge lines extending in the direction perpendicular or substantially perpendicular to the main surface of the outer electrodes 111 and 112. In this structure, the solder 300 adheres to the outer electrodes 111 and 112 so as to extend along the four ridge lines from the respective lower ends of the four ridge lines of the outer electrodes 111 and 112 corresponding to the cutouts Cd11, Cd12, Cd13, and Cd14 near the four corners, as illustrated in FIGS. 3A-3C. Since this causes the solder 300 not to adhere to portions near the centers of the end surfaces of the outer electrodes 111 and 112, it is possible to effectively reduce or prevent the occurrence of the vibration sound caused by the strain of the multilayer ceramic capacitor 11 described above.

FIG. 4 is a graph indicating the relationship between a sound pressure level and frequency characteristics in the structure of the present preferred embodiment and in structures in the related art. The structures in the related art in FIG. 4 include a structure (a mode T0) in which the multilayer ceramic capacitor is directly mounted on the circuit board without using the interposer and a structure (a mode I0) in which the entire end surface is soldered around the center of the end surface of each outer electrode with the interposer being used. As illustrated in FIG. 4, the use of the structure of the present preferred embodiment allows the sound pressure level of the vibration sound to be greatly reduced or prevented in a wider frequency band, compared with the mode T0 in the related art. Similarly, the sound pressure level of the vibration sound is effectively reduced or prevented, also compared with the mode I0 in the related art.

In addition, the use of the interposer 12 including the thin insulating substrate 120 as in the present preferred embodiment allows an increase in height of the electronic component 10 to be prevented to achieve low profile. Since the structure is adopted in which the multilayer ceramic capacitor 11 and the interposer 12 are stacked and mounted on the circuit board 20 so that the main surface of the multilayer ceramic capacitor 11 coincides with the main surface of the interposer 12 in the length direction, the higher bonding strength is realized. Accordingly, it is possible to achieve the bonding strength substantially similar to the one in the case in which the multilayer ceramic capacitor 11 is directly mounted on the circuit board 20.

Furthermore, in the above preferred embodiment, the shapes of the mounting lands 201 and 202 and the distance between the mounting lands 201 and 202 are set according to the same specifications as those in the case in which the multilayer ceramic capacitor 11 is directly mounted on the circuit board 20.

As described above, in the electronic component 10 of the present preferred embodiment, the positions of the IP electrodes 121 and 122 of the interposer 12 are overlapped with the positions of the outer electrodes 111 and 112 of the multilayer ceramic capacitor 11, viewed from the direction perpendicular or substantially perpendicular to the main surface, and the connection electrodes 401 to 404 exist at substantially the same positions as the four ridge lines of the outer electrodes 111 and 112 of the multilayer ceramic capacitor 11. Accordingly, the electronic component 10 is mounted with the mounting lands 201 and 202 having the same specifications as those in the case in which the multilayer ceramic capacitor 11 is directly mounted on the circuit board 20. In other words, it is not necessary to change the design of the mounting lands 201 and 202 of the circuit board 20. In addition, the electronic component 10 is mounted in approximately the same area as that in the case in which only a multilayer ceramic capacitor 11 is mounted on the circuit board 20. Accordingly, it is possible to connect the multilayer ceramic capacitor 11 to the circuit board 20 with little increase in two-dimensional size even with the interposer 12.

Figure 5A:
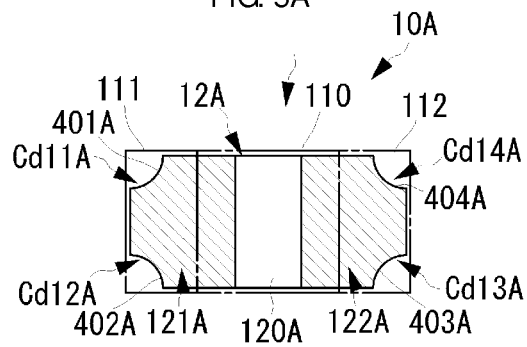
FIGS. 5A-5D include orthographic views illustrating an exemplary structure of an electronic component 10A including an interposer 12A according to a second preferred embodiment of the present invention and a diagram indicating the relationship between the shape of the interposer 12A and that of the multilayer ceramic capacitor 11.
Figure 5C:
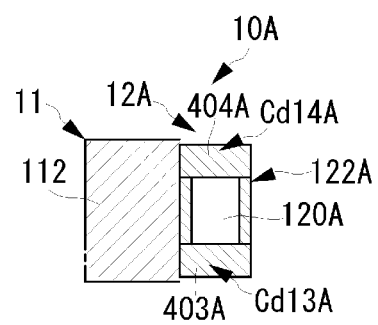
Figure 5B:
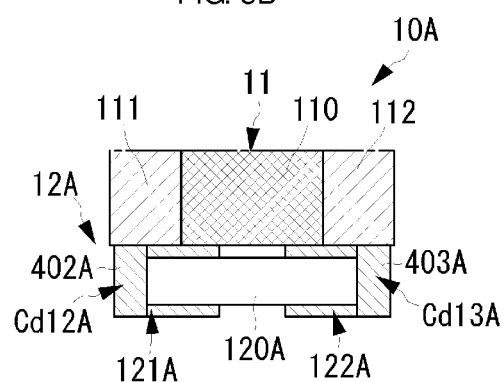
Figure 5D:
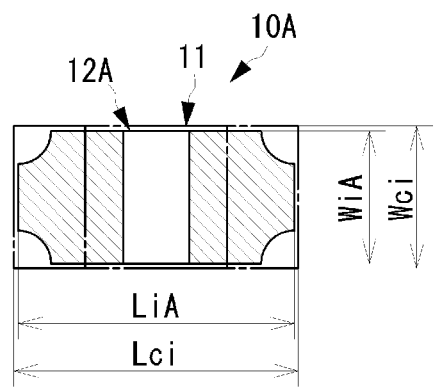
Figure 6A:
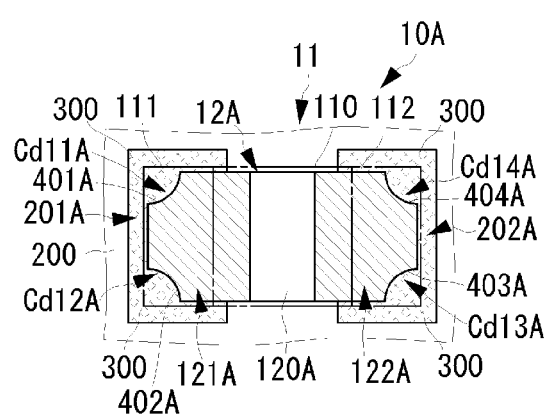
FIGS. 6A-6C are orthographic views indicating a state in which the electronic component 10A according to the second preferred embodiment is mounted on the circuit board 20.
Figure 6C:
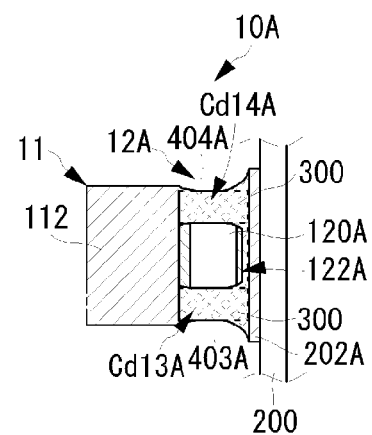
Figure 6B:
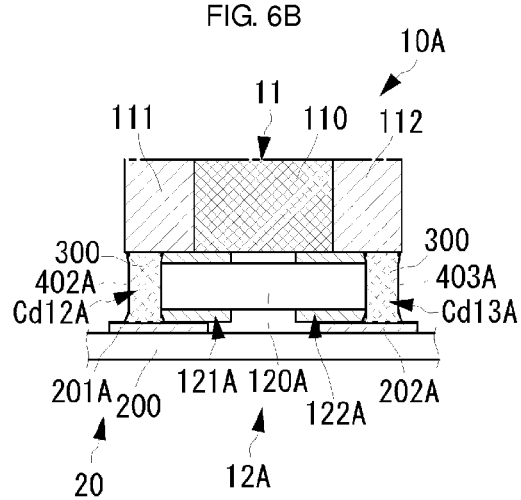

An electronic component according to a second preferred embodiment will now be described with reference to the drawings. FIG. 5A to FIG. 5C are orthographic views illustrating an exemplary structure of an electronic component 10A including an interposer 12A according to the present preferred embodiment. FIG. 5D is a diagram indicating the relationship between the shape of the interposer 12A and that of the multilayer ceramic capacitor 11. FIGS. 6A-6C include orthographic views indicating a state in which the electronic component 10A according to the present preferred embodiment is mounted on the circuit board 20.

Although the interposer 12A of the present preferred embodiment preferably has the same basic structure as that of the interposer 12 indicated in the first preferred embodiment, the interposer 12A of the present preferred embodiment differs from the interposer 12 of the first preferred embodiment in length and width.

As illustrated in FIG. 5D, a length LiA of an insulating substrate 120A is slightly shorter than the length Lci of the multilayer ceramic capacitor 11. Specifically, LiA≅Lci and LiA<Lci. The width of the interposer 12A, that is, the insulating substrate 120A is substantially the same as and shorter than the width of the multilayer ceramic capacitor 11. Specifically, WiA≅Wci and WiA<Wci.

If a large amount of solder is supplied in the soldering on the circuit board 20 in the same manner as in the first preferred embodiment in the above structure, the solder 300 adheres to the outer electrodes 111 and 112 so as to be arranged along the four ridge lines from the respective lower ends of the four ridge lines of the outer electrodes 111 and 112 corresponding to cutouts Cd11A, Cd12A, Cd13A, and Cd14A (connection electrodes 401A, 402A, 403A, and 404A), as illustrated in FIG. 6. Since this causes the solder 300 not to adhere to portions near the centers of the end surfaces of the outer electrodes 111 and 112, it is possible to effectively reduce or prevent the occurrence of the vibration sound caused by the strain of the multilayer ceramic capacitor 11 described above.

In addition, the same mounting lands as those in the case in which only a multilayer ceramic capacitor 11 is mounted on the circuit board 20 are used in the structure of the present preferred embodiment. The electronic component 10A is mounted in the same area as that in the case in which only a multilayer ceramic capacitor 11 is mounted on the circuit board 20. Accordingly, it is possible to further reduce the size even with the interposer 12A.

Figure 7A:
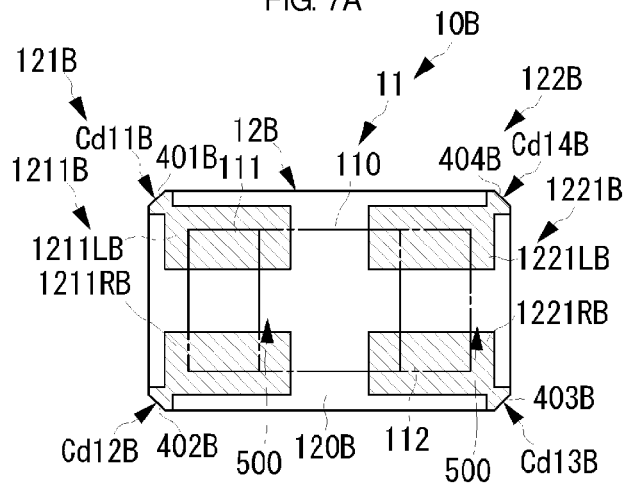
FIGS. 7A-7D include orthographic views illustrating an exemplary structure of an electronic component 10B including an interposer 12B according to a third preferred embodiment of the present invention and a diagram indicating the relationship between the shape of the interposer 12B and that of the multilayer ceramic capacitor 11.
Figure 7C:
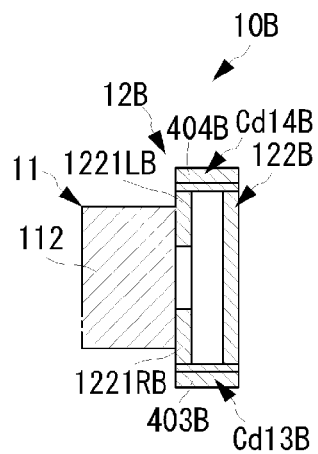
Figure 7B:
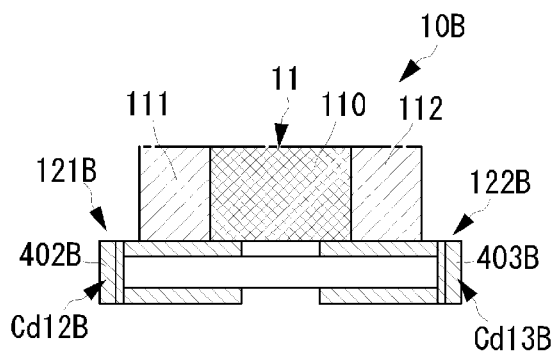
Figure 7D:
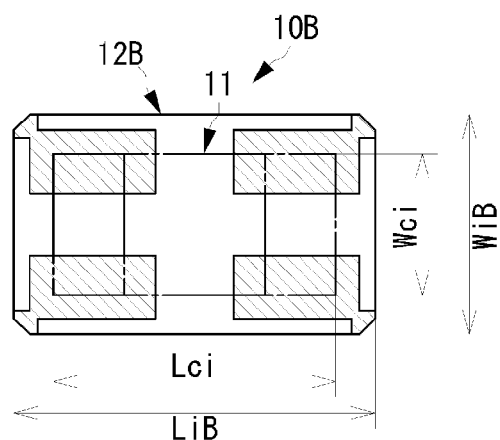

An electronic component according to a third preferred embodiment will now be described with reference to the drawings. FIG. 7A to FIG. 7C are orthographic views illustrating an exemplary structure of an electronic component 10B including an interposer 12B according to the present preferred embodiment. FIG. 7D is a diagram indicating the relationship between the shape of the interposer 12B and that of the multilayer ceramic capacitor 11.

As illustrated in FIG. 7D, the interposer 12B of the present preferred embodiment has a structure that is greater than that of the interposer 12 indicated in the first preferred embodiment in length and width. Specifically, LiB>Lci and WiB>Wci, where LiB denotes the length of the interposer 12B and the WiB denotes the width thereof.

In the interposer 12B, cutouts Cd11B, Cd12B, Cd13B, and Cd14B preferably have a linear shape, viewed from the direction perpendicular or substantially perpendicular to the main surface. The cutouts Cd11B, Cd12B, Cd13B, and Cd14B preferably have a shape that does not enter the inside of the outline shape of the multilayer ceramic capacitor 11, viewed from the direction perpendicular or substantially perpendicular to the main surface. Even in such a shape, connection electrodes 401B, 402B, 403B, and 404B provided at the cutouts Cd11B, Cd12B, Cd13B, and Cd14B, respectively, are closest to the end portions at the interposer 12B side of the four ridge lines, which extend in the direction perpendicular or substantially perpendicular to the main surface, of the outer electrodes 111 and 112 of the multilayer ceramic capacitor 11. Accordingly, even if the solder rises via the connection electrodes 401B, 402B, 403B, and 404B to adhere to the outer electrodes 111 and 112, the solder adheres only to portions near the four ridge lines of the outer electrodes 111 and 112. Consequently, it is possible to significantly reduce or prevent the occurrence of the vibration sound, as in the above preferred embodiments.

In addition, an upper surface electrode 1211B of an IP electrode 121B of the interposer 12B preferably includes partial upper surface electrodes 1211LB and 1211RB that are separated from each other in the width direction. In other words, an electrode separating portion 500 (corresponding to a "contact limiting unit") sandwiched between the partial upper surface electrodes 1211LB and 1211RB is provided on the upper surface of the interposer 12B. The partial upper surface electrodes 1211LB and 1211RB are located within a range including the positions of two ridge lines of the outer electrode 111.

An upper surface electrode 1221B of an IP electrode 122B of the interposer 12B preferably includes partial upper surface electrodes 1221LB and 1221RB that are separated from each other in the width direction. In other words, the electrode separating portion 500 (corresponding to the "contact limiting unit") sandwiched between the partial upper surface electrodes 1221LB and 1221RB is provided on the upper surface of the interposer 12B. These partial upper surface electrodes 1221LB and 1221RB are located within a range including the positions of two ridge lines of the outer electrode 112.

Since no upper surface electrode is located near the centers in the width direction of the end surfaces of the outer electrodes 111 and 112 (in the electrode separating portion 500) in the above structure, it is possible to prevent the solder from adhering to portions near the centers in the width direction of the end surfaces of the outer electrodes 111 and 112. Accordingly, it is possible to more reliably reduce or prevent the occurrence of the vibration sound.

Although the lower electrodes of the IP electrodes 121B and 122B are not separated from each other in the width direction in FIG. 7, the lower electrodes of the IP electrodes 121B and 122B may be separated from each other in the width direction.

Figure 8A:
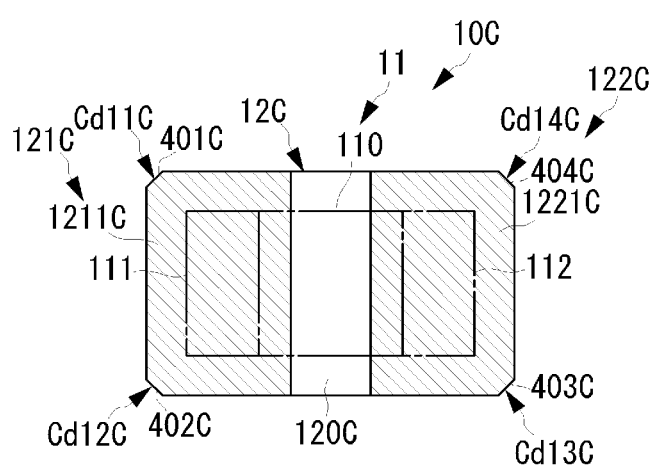
FIGS. 8A-8C are orthographic views illustrating an exemplary structure of an electronic component 10C including an interposer 12C according to a fourth preferred embodiment of the present invention.
Figure 8C:
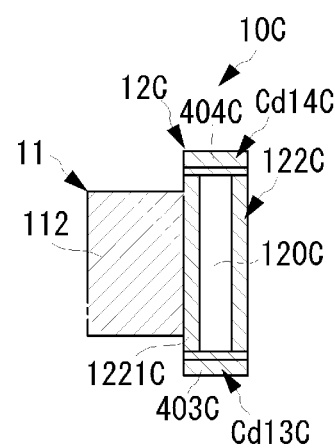
Figure 8B:
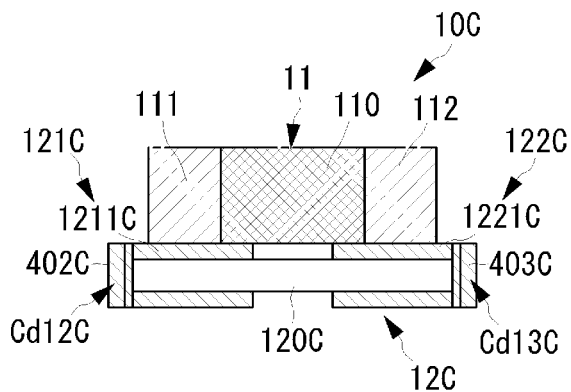

An electronic component according to a fourth preferred embodiment will now be described with reference to the drawings. FIGS. 8A-8C include orthographic views illustrating an exemplary structure of an electronic component 10C including an interposer 12C according to the present preferred embodiment.

In the interposer 12C of the present preferred embodiment, the upper electrodes are preferably arranged over the entire width of the interposer 12C. The remaining structure of the interposer 12C of the present preferred embodiment is preferably the same as that of the interposer 12B indicated in the third preferred embodiment.

An upper surface electrode 1211C of an IP electrode 121C of the present preferred embodiment is arranged over the entire width of the interposer 12C. An upper surface electrode 1221C of an IP electrode 122C is also arranged over the entire width of the interposer 12C.

Even in such a structure, connection electrodes 401C, 402C, 403C, and 404C provided at cutouts Cd11C, Cd12C, Cd13C, and Cd14C, respectively, are closest to the end portions at the interposer 12C side of the four ridge lines, which extend in the direction perpendicular or substantially perpendicular to the main surface, of the outer electrodes 111 and 112 of the multilayer ceramic capacitor 11, as described above in the third preferred embodiment. Accordingly, even if the solder rises via the connection electrodes 401C, 402C, 403C, and 404C to adhere to the outer electrodes 111 and 112, the solder adheres only to portions near the four ridge lines of the outer electrodes 111 and 112. Consequently, it is possible to significantly reduce or prevent the occurrence of the vibration sound, as in the third preferred embodiment.

An electronic component according to a fifth preferred embodiment will now be described with reference to the drawings. FIGS. 9A-9C include orthographic views illustrating an exemplary structure of an electronic component 10D including an interposer 12D according to the present preferred embodiment.

In the interposer 12D of the present preferred embodiment, a solder resist film Re12 is provided on upper surface electrode 1211D and 1221D. The remaining structure of the interposer 12D of the present preferred embodiment is preferably the same as that of the interposer 12 indicated in the first preferred embodiment.

The solder resist film Re12 corresponds to the "contact limiting unit". The solder resist film Re12 is located within a range of a predetermined width including positions where perpendicular portions that are extended down from the center positions in the width direction of the outer electrodes 111 and 112 of the multilayer ceramic capacitor 11 to the upper surface electrodes 1211D and 1221D intersect at right angles with the upper surface electrodes 1211D and 1221D, respectively. The solder resist film Re12 is located within a range of a predetermined length including the positions where the perpendicular portions intersect at right angles with the upper surface electrodes 1211D and 1221D, respectively, also in the length direction of the interposer 12D. Accordingly, the portions near the centers in the width direction of the outer electrodes 111 and 112 are not in contact with the upper surface electrodes 1211D and 1221D of IP electrodes 121D and 122D, respectively.

Accordingly, even if the solder rises to the upper surface electrodes 1211D and 1221D in the above manner, the solder does not adhere to the portions near the centers of the outer electrodes 111 and 112 due to the presence of the solder resist film Re12. Consequently, it is possible to more reliably reduce or prevent the occurrence of the vibration sound.

Figure 10A:
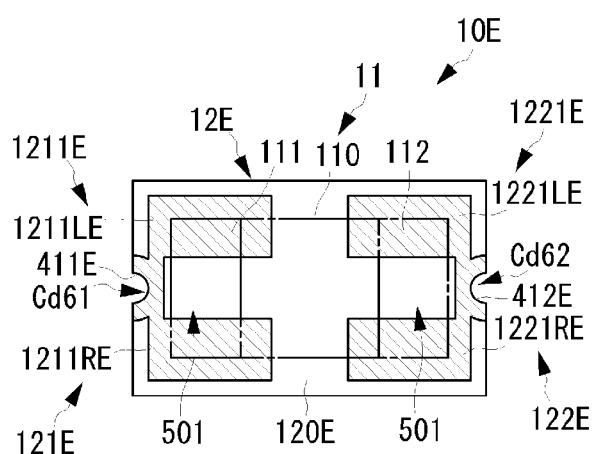
FIGS. 10A-10C are orthographic views illustrating an exemplary structure of an electronic component 10E including an interposer 12E according to a sixth preferred embodiment of the present invention.
Figure 10C:
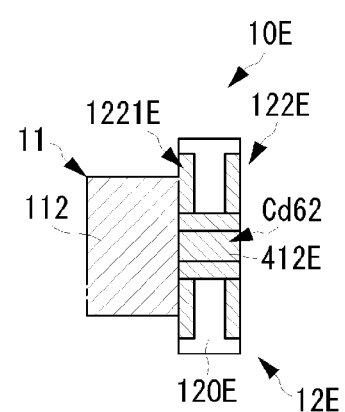
Figure 10B:
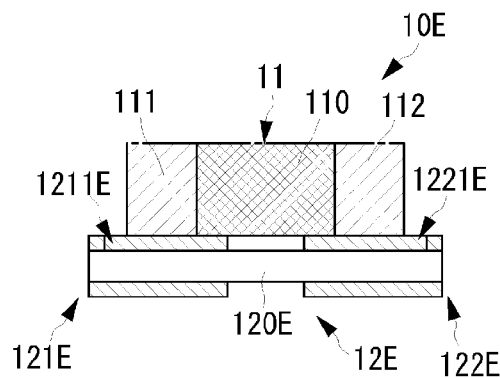

An electronic component according to a sixth preferred embodiment will now be described with reference to the drawings. FIGS. 10A-10C include orthographic views illustrating an exemplary structure of an electronic component 10E including an interposer 12E according to the present preferred embodiment. The graphical representation of the multilayer ceramic capacitor 11 is simplified in FIG. 10 in order to explicitly indicate the structure of the interposer 12E.

The interposer 12E of the present preferred embodiment differs from the third preferred embodiment in the positions where cutouts Cd61 and Cd62 are provided. The remaining structure of the interposer 12E of the present preferred embodiment is preferably the same as that of the interposer 12B indicated in the third preferred embodiment.

An upper surface electrode 1211E of an IP electrode 121E of the interposer 12E includes partial upper surface electrodes 1211LE and 1211RE that are arranged so as to be separated from each other in the width direction of the interposer 12E, that is, an insulating substrate 120E. In other words, an electrode separating portion 501 sandwiched between the partial upper surface electrodes 1211LE and 1211RE is provided on the upper surface of the interposer 12E. In the electrode separating portion 501, the upper surface of the insulating substrate 120E of the interposer 12E directly opposes the outer electrode 111 of the multilayer ceramic capacitor 11. The partial upper surface electrodes 1211LE and 1211RE are connected to each other with a connection electrode that is near one end in the length direction of the insulating substrate 120E and that is located toward the end portion with respect to the position where the outer electrode 111 of the multilayer ceramic capacitor 11 is placed and held.

The cutout Cd61 is located at the position corresponding substantially to the center in the width direction of the insulating substrate 120E on the end surface at the side where the IP electrode 121E of the insulating substrate 120E is located. The cutout Cd61 preferably has an arc shape, viewed from the direction perpendicular or substantially perpendicular to the main surface, as in the cutouts Cd11, Cd12, Cd13, and Cd14 indicated in the first preferred embodiment. A connection electrode 411E is located on the wall of the cutout Cd61. The connection electrode 411E is connected to the partial upper surface electrodes 1211LE and 1211RE via the electrode connecting the partial upper surface electrode 1211LE to the partial upper surface electrode 1211RE.

An upper surface electrode 1221E of an IP electrode 122E of the interposer 12E includes partial upper surface electrodes 1221LE and 1221RE that are arranged so as to be separated from each other in the width direction of the interposer 12E, that is, the insulating substrate 120E. In other words, the electrode separating portion 501 sandwiched between the partial upper surface electrodes 1221LE and 1221RE is located on the upper surface of the interposer 12E. In the electrode separating portion 501, the upper surface of the insulating substrate 120E of the interposer 12E directly opposes the outer electrode 112 of the multilayer ceramic capacitor 11. The partial upper surface electrodes 1221LE and 1221RE are connected to each other with a connection electrode that is near the other end in the length direction of the insulating substrate 120E and that is located toward the end portion with respect to the position where the outer electrode 112 of the multilayer ceramic capacitor 11 is placed and held.

The cutout Cd62 is located at the position corresponding substantially to the center in the width direction of the insulating substrate 120E on the end surface at the side where the IP electrode 122E of the insulating substrate 120E is located. The cutout Cd62 preferably has an arc shape, viewed from the direction perpendicular or substantially perpendicular to the main surface, like the cutout Cd61. A connection electrode 412E is located on the wall of the cutout Cd62. The connection electrode 412E is connected to the partial upper surface electrodes 1221LE and 1221RE via the electrode connecting the partial upper surface electrode 1221LE to the partial upper surface electrode 1221RE.

In the above structure, even with the cutouts Cd61 and Cd62 that include the connection electrodes 411E and 412E, respectively, and that are disposed at the center in the width direction of the interposer 12E, the solder that has risen to the upper surface electrodes 1211E and 1221E in the manner described in the above preferred embodiments adheres to the portions near the four ridge lines of the outer electrodes 111 and 112 and does not adhere to the portions near the centers in the width direction. Accordingly, it is possible to significantly reduce or prevent the occurrence of the vibration sound, as in the above preferred embodiments, and to achieve the advantages described above.

Figure 11A:
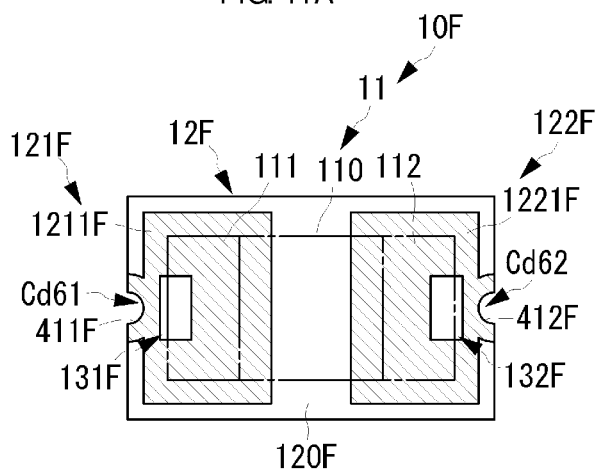
FIGS. 11A-11C are orthographic views illustrating an exemplary structure of an electronic component 10F including an interposer 12F according to a seventh preferred embodiment of the present invention.
Figure 11C:
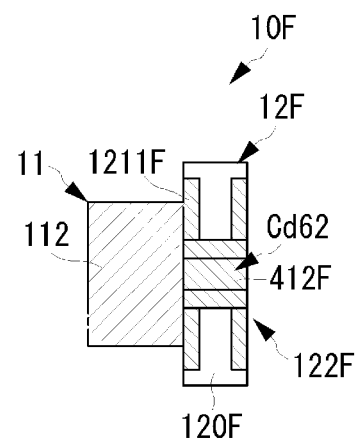
Figure 11B:
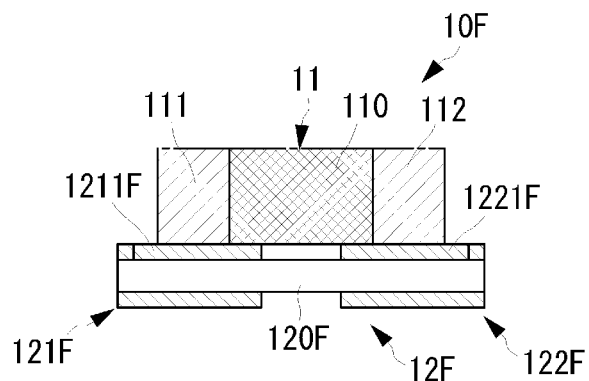

An electronic component according to a seventh preferred embodiment will now be described with reference to the drawings. FIGS. 11A-11C include orthographic views illustrating an exemplary structure of an electronic component 10F including an interposer 12F according to the present preferred embodiment. The graphical representation of the multilayer ceramic capacitor 11 is simplified in FIGS. 11A-11C in order to explicitly indicate the structure of the interposer 12F.

The interposer 12F of the present preferred embodiment differs from the interposer 12E indicated in the sixth preferred embodiment in that upper surface electrodes 1211F and 1221F are arranged over substantially the entire width of an insulating substrate 120F and that electrode non-formation portions 131F and 132F are partially provided in the upper surface electrodes 1211F and 1221F, respectively. The remaining structure of the interposer 12F of the present preferred embodiment is preferably the same as that of the interposer 12E of the sixth preferred embodiment.

The electrode non-formation portion 131F is located within a range of a predetermined width including a position where a perpendicular portion that is extended down from the center position in the width direction of the outer electrode 111 of the multilayer ceramic capacitor 11 to the upper surface electrode 1211F intersects at right angles with the upper surface electrode 1211F. The electrode non-formation portion 131F is located within a range of a predetermined length including the position where the perpendicular portion intersects at right angles with the upper surface electrode 1211F also in the length direction of the interposer 12F, that is, in the length direction of the insulating substrate 120F. In other words, an open pattern of the electrode is located near the center in the width direction of the outer electrode 111 on the upper surface of the interposer 12F. With the above structure, a portion near the center in the width direction of the outer electrode 111 is not in contact with the upper surface electrode 1211F of an IP electrode 121F.

Similarly, the electrode non-formation portion 132F is located within a range of a predetermined width including a position where a perpendicular portion that is extended down from the center position in the width direction of the outer electrode 112 of the multilayer ceramic capacitor 11 to the upper surface electrode 1221F intersects at right angles with the upper surface electrode 1221F. The electrode non-formation portion 132F is located within a range of a predetermined length including the position where the perpendicular portion intersects at right angles with the upper surface electrode 1221F also in the length direction of the interposer 12F, that is, in the length direction of the insulating substrate 120F. In other words, an open pattern of the electrode is located near the center in the width direction of the outer electrode 112 on the upper surface of the interposer 12F. With the above structure, a portion near the center in the width direction of the outer electrode 112 is not in contact with the upper surface electrode 1221F of an IP electrode 122F.

Accordingly, even if the solder rises to the upper surface electrodes 1211F and 1221F via connection electrodes 411F and 412F in the above manner, the solder does not adhere to portions near the centers of the outer electrodes 111 and 112 due to the presence of the electrode non-formation portions 131F and 132F, respectively. Consequently, it is possible to significantly reduce or prevent the occurrence of the vibration sound.

Figure 12A:
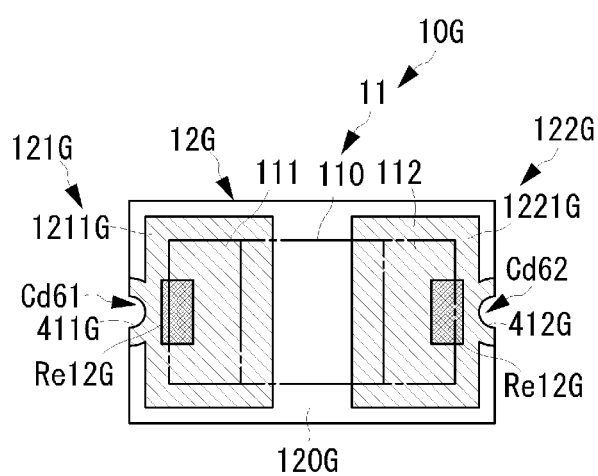
FIGS. 12A-12C are orthographic views illustrating an exemplary structure of an electronic component 10G including an interposer 12G according to an eighth preferred embodiment of the present invention.
Figure 12C:
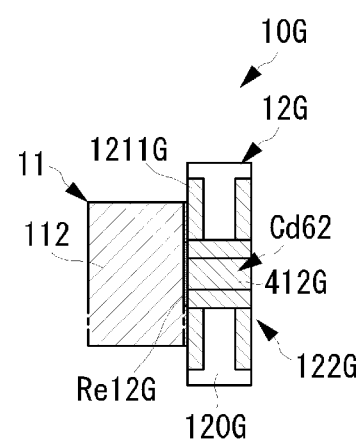
Figure 12B:
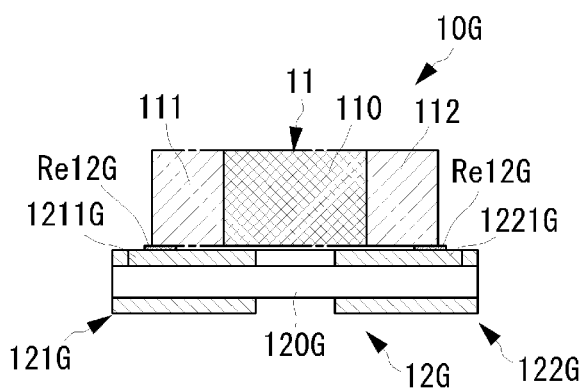

An electronic component according to an eighth preferred embodiment will now be described with reference to the drawings. FIGS. 12A-12C include orthographic views illustrating an exemplary structure of an electronic component 10G including an interposer 12G according to the present preferred embodiment. The graphical representation of the multilayer ceramic capacitor 11 is simplified in FIGS. 12A-12C in order to explicitly indicate the structure of the interposer 12G.

In the interposer 12G of the present preferred embodiment, a solder resist film Re12G is located at the same positions as those of the electrode non-formation portions 131F and 132F indicated in the seventh preferred embodiment. The remaining structure of the interposer 12G of the present preferred embodiment is preferably the same as that of the seventh preferred embodiment. Although FIGS. 12A-12C show upper surface electrodes located at the corresponding positions, no upper surface electrode may be formed at the corresponding positions. The solder resist film Re12G corresponds to the "contact limiting unit".

With such a structure, even if the solder rises to upper surface electrodes 1211G and 1221G via connection electrodes 411G and 412G in the above manner, the solder does not adhere to portions near the centers of the outer electrodes 111 and 112, respectively, due to the presence of the solder resist film Re12G. Consequently, it is possible to significantly reduce or prevent the occurrence of the vibration sound.

Figure 13A:
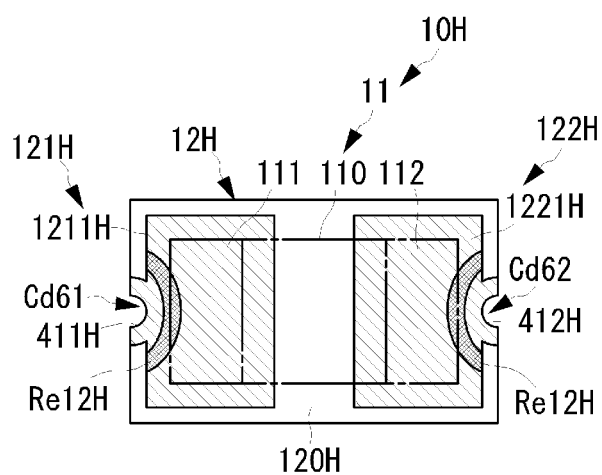
FIGS. 13A-13C are orthographic views illustrating an exemplary structure of an electronic component 10H including an interposer 12H according to a ninth preferred embodiment of the present invention.
Figure 13C:
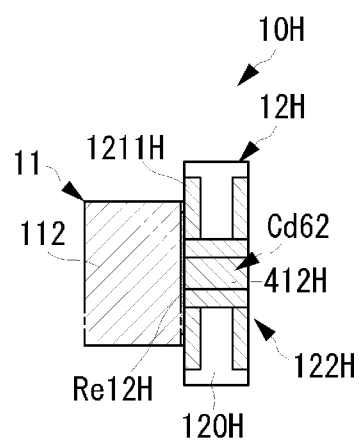
Figure 13B:
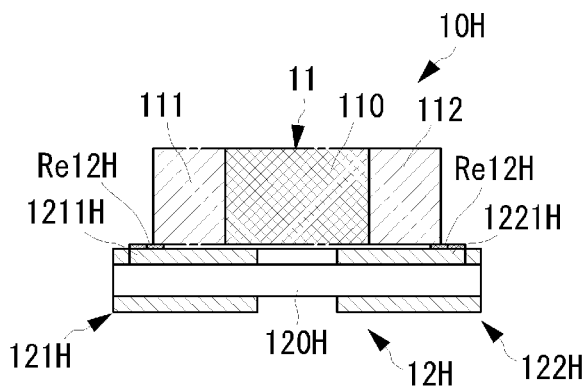

An electronic component according to a ninth preferred embodiment will now be described with reference to the drawings. FIGS. 13A-13C include orthographic views illustrating an exemplary structure of an electronic component 10H including an interposer 12H according to the present preferred embodiment. The graphical representation of the multilayer ceramic capacitor 11 is simplified in FIGS. 13A-13C in order to explicitly indicate the structure of the interposer 12H.

In the interposer 12H of the present preferred embodiment, upper surface electrodes 1211H and 1221H are arranged over substantially the entire width of an insulating substrate 120H without forming the electrode non-formation portions 131F and 132F indicated in the seventh preferred embodiment and a solder resist film Re12H is provided on the upper surface electrodes 1211H and 1221H. The remaining structure of the interposer 12H of the present preferred embodiment is preferably the same as that of the seventh preferred embodiment.

The solder resist film Re12H is located within a range of a predetermined width including positions where perpendicular portions that are extended down from the center positions in the width direction of the outer electrodes 111 and 112 of the multilayer ceramic capacitor 11 to the upper surface electrodes 1211H and 1221H intersect at right angles with the upper surface electrodes 1211H and 1221H, respectively. The solder resist film Re12H is located within a range of a predetermined length including the positions where the perpendicular portions intersect at right angles with the upper surface electrodes 1211H and 1221H, respectively, also in the length direction of the interposer 12H. The solder resist film Re12H corresponds to the "contact limiting unit".

In addition, the solder resist film Re12H preferably has a shape in which the solder resist film Re12H divides the upper surface electrodes 1211H and 1221H into areas where the upper surface electrodes 1211H and 1221H are connected to connection electrodes 411H and 412H of the cutouts Cd61 and Cd62 and areas where the upper surface electrodes 1211H and 1221H are in contact with the four ridge lines of the outer electrodes 111 and 112, viewed from the direction perpendicular or substantially perpendicular to the main surface of the insulating substrate 120H. For example, as illustrated in FIG. 13A, the solder resist film Re12H preferably has an arc shape that has the center at the sides of the cutouts Cd61 and Cd62, that passes through portions near the centers in the width direction of the outer electrodes 111 and 112, and that has a predetermined width.

With such a structure, even if the solder rises to upper surface electrodes 1211H and 1221H via the connection electrodes 411H and 412H in the above manner, no solder adheres to the outer electrodes 111 and 112 due to the presence of the solder resist film Re12H. Consequently, it is possible to more reliably reduce or prevent the occurrence of the vibration sound.

Figure 14A:
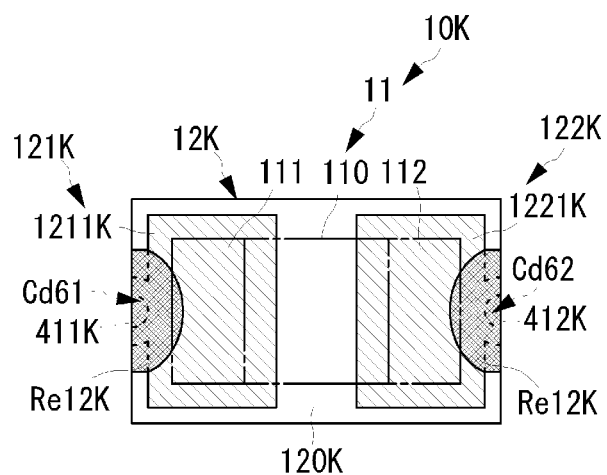
FIGS. 14A-14C are orthographic views illustrating an exemplary structure of an electronic component 10K including an interposer 12K according to a tenth preferred embodiment of the present invention.
Figure 14C:
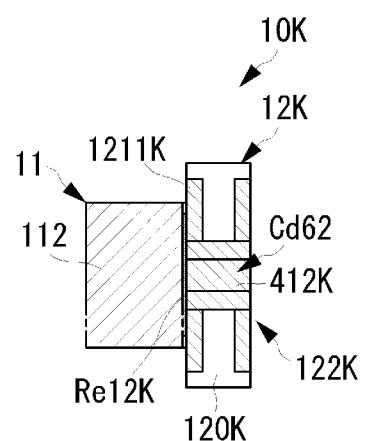
Figure 14B:
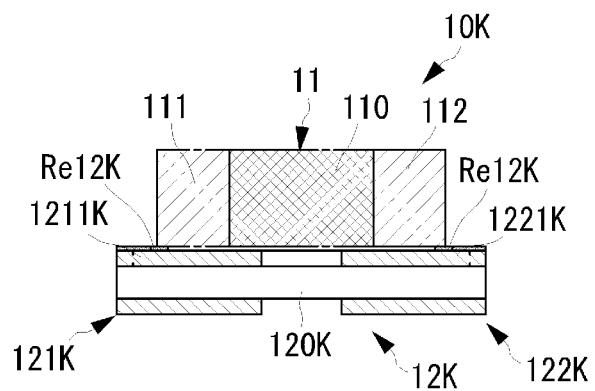

An electronic component according to a tenth preferred embodiment will now be described with reference to the drawings. FIGS. 14A-14C include orthographic views illustrating an exemplary structure of an electronic component 10K including an interposer 12K according to the present preferred embodiment. The graphical representation of the multilayer ceramic capacitor 11 is simplified in FIGS. 14A-14C in order to explicitly indicate the structure of the interposer 12K.

The interposer 12K of the present preferred embodiment differs from the interposer 12H indicated in the ninth preferred embodiment in the shape of a solder resist film Re12K. The remaining structure of the interposer 12K of the present preferred embodiment is the same as that of the interposer 12H of the ninth preferred embodiment.

The solder resist film Re12K preferably has a shape in which positions where perpendicular portions that are extended down from the center positions in the width direction of the outer electrodes 111 and 112 of the multilayer ceramic capacitor 11 to upper surface electrodes 1211K and 1221K intersect at right angles with the upper surface electrodes 1211K and 1221K, respectively, are included in the length direction of the interposer 12K and in which the solder resist film Re12K reaches both ends in the length direction. The solder resist film Re12K corresponds to a "limiting unit".

The solder resist film Re12K preferably has a shape in which open ends at the side of the upper surface electrodes 1211K and 1221K of the cutouts Cd61 and Cd62 including connection electrodes 411K and 412K, respectively, are covered with the solder resist film Re12K.

With such a structure, even if the solder rises along the connection electrodes 411K and 421K of the cutouts Cd61 and Cd62, respectively, in the mounting of the electronic component 10K on the circuit board, the solder resist film Re12K blocks the rise of the solder to the upper surface side of the interposer 12K. Accordingly, it is possible to prevent the solder for mounting on the circuit board from unnecessarily adhering to the upper surface side of the interposer 12K, that is, the outer electrodes 111 and 112 of the multilayer ceramic capacitor 11. As a result, it is possible to significantly reduce or prevent the occurrence of the vibration sound, as in the above preferred embodiments.

Figure 15A:
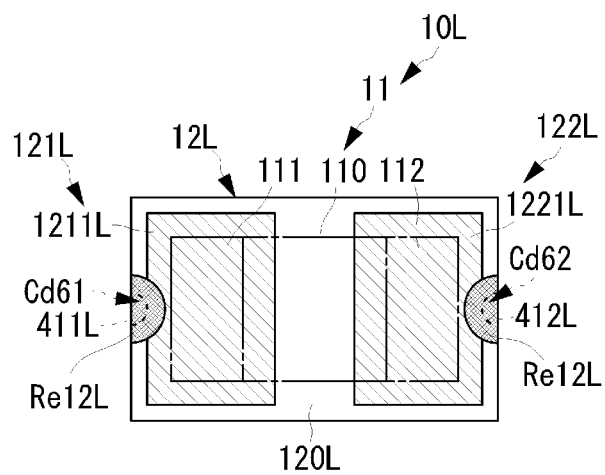
FIGS. 15A-15C are orthographic views illustrating an exemplary structure of an electronic component 10L including an interposer 12L according to an eleventh preferred embodiment of the present invention.
Figure 15C:
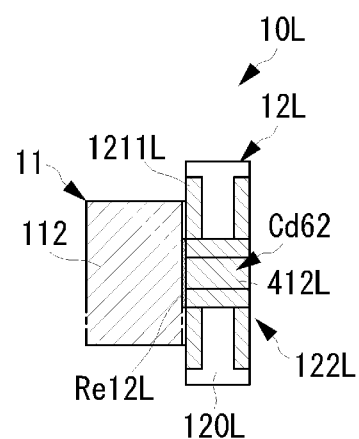
Figure 15B:
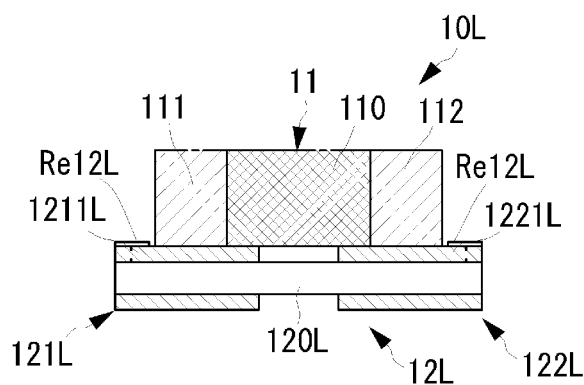

An electronic component according to an eleventh preferred embodiment will now be described with reference to the drawings. FIGS. 15A-15C include orthographic views illustrating an exemplary structure of an electronic component 10L including an interposer 12L according to the present preferred embodiment. The graphical representation of the multilayer ceramic capacitor 11 is simplified in FIGS. 15A-15C in order to explicitly indicate the structure of the interposer 12L.

The interposer 12L of the present preferred embodiment differs from the interposer 12K indicated in the tenth preferred embodiment in the shape of a solder resist film Re12L. The remaining structure of the interposer 12L of the present preferred embodiment is preferably the same as that of the interposer 12K of the tenth preferred embodiment.

The solder resist film Re12L preferably has a shape in which the cutouts Cd61 and Cd62 including connection electrodes 411L and 412L, respectively, of the interposer 12L are covered with the solder resist film Re12L at the sides of upper surface electrodes 1211L and 1221L, as in the interposer 12K of the tenth preferred embodiment. However, the solder resist film Re12L of the present preferred embodiment preferably has a shape in which the end portions toward the center in the length direction of the solder resist film Re12L do not reach positions where the outer electrodes 111 and 112 of the multilayer ceramic capacitor 11 abut against (are mounted to) the upper surface electrodes 1211L and 1221L, respectively. In other words, the solder resist film Re12L preferably has a shape as small as possible as long as the cutouts Cd61 and Cd62 are covered with the solder resist film Re12L. The solder resist film Re12L corresponds to the "limiting unit".

The formation of the solder resist film Re12L having the above structure prevents the solder for mounting on the circuit board from unnecessarily adhering to the upper surface side of the interposer 12L, that is, the outer electrodes 111 and 112 of the multilayer ceramic capacitor 11 also in the interposer 12L of the present preferred embodiment, as in the interposer 12K indicated in the tenth preferred embodiment described above. As a result, it is possible to significantly reduce or prevent the occurrence of the vibration sound, as in the above preferred embodiments.

In addition, since the solder resist film Re12L has a shape that does not spread to the area where the multilayer ceramic capacitor 11 is mounted in the structure of the present preferred embodiment, the solder resist film Re12L does not exist between the bottom surfaces of the outer electrodes 111 and 112 of the multilayer ceramic capacitor 11 and the upper surface electrodes 1211L and 1221L in the mounting of the multilayer ceramic capacitor 11 on the upper surface electrodes 1211L and 1221L. Accordingly, the bottom surfaces of the outer electrodes 111 and 112 of the multilayer ceramic capacitor 11 reliably abut against the upper surface electrodes 1211L and 1221L without being separated. Consequently, the bonding strength between the bottom surfaces of the outer electrodes 111 and 112 of the multilayer ceramic capacitor 11 and the upper surface electrodes 1211L and 1221L is improved.

Although the solder resist films indicated in the tenth preferred embodiment and the eleventh preferred embodiment are each preferably provided only in the central area in the width direction of the interposer, the solder resist films may be arranged over the entire width.

Although the interposers indicated in the tenth preferred embodiment and the eleventh preferred embodiment each preferably include the cutouts at the central portions in the width direction, the solder resist film may be arranged so that the cutouts provided at the corners indicated in the above preferred embodiments are covered with the solder resist film. Also in this case, it is possible to prevent unnecessary adherence of the solder on the outer electrodes, as in the tenth preferred embodiment and the eleventh preferred embodiment.

Although the solder resist films are preferably used for the interposers indicated in the tenth preferred embodiment and the eleventh preferred embodiment, a metal film may be arranged so that the cutouts are covered with the metal film from the side of the upper surface electrodes as long as the metal film is formed of a plate material that blocks the rise of the solder.

The structure of each of the above preferred embodiments may be used as it is, or a combination of the structures of multiple preferred embodiments may be used. The effects and advantages similar to those in the above preferred embodiments are achieved as long as a shape derived from the structures of the preferred embodiments is adopted.

Although the electrode non-formation portion or the resist film is preferably provided for the insulating substrate to significantly reduce or prevent adherence of the solder to the central portions of the end surfaces of the outer electrodes 111 and 112 of the multilayer ceramic capacitor 11 in the above preferred embodiments, the electrode non-formation portion or the resist film may be formed on the outer electrodes 111 and 112.

Figure 16A:
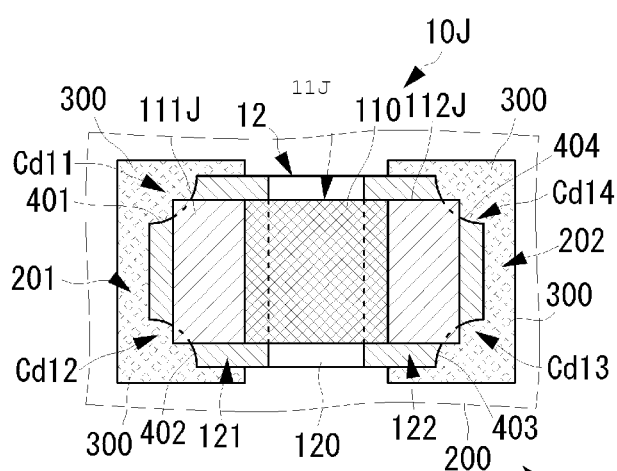
FIGS. 16A-16C are orthographic views indicating a state in which an electronic component 10J according to another preferred embodiment of the present invention is mounted on a circuit board 200.
Figure 16C:
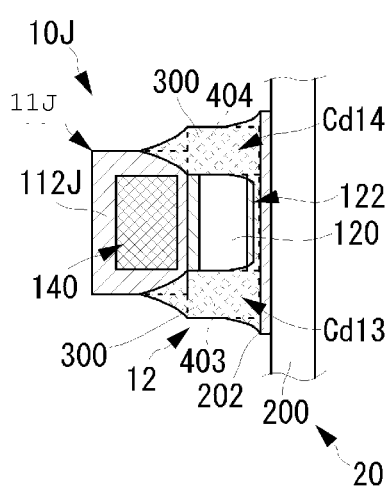
Figure 16B:
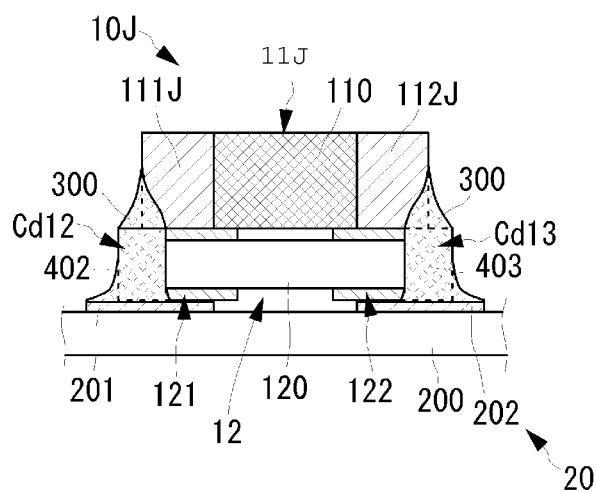

FIGS. 16A-16C include orthographic views indicating a state in which an electronic component 10J according to another preferred embodiment is mounted on a circuit board 200.

The electronic component 10J illustrated in FIGS. 16A-16C differs from the electronic component 10 indicated in the first preferred embodiment with respect to the outer electrodes of a multilayer ceramic capacitor 11J. The remaining structure of the electronic component 10J illustrated in FIGS. 16A-16C is the same as that of the electronic component 10 of the first preferred embodiment.

Outer electrodes 111J and 112J of the multilayer ceramic capacitor 11J of the electronic component 10J include an electrode non-formation portion 140 of a predetermined area provided on an end surface in the longitudinal direction of the component body 110, that is, provided in a central portion of the surface where the outer electrodes 111J and 112J are formed, as illustrated in FIG. 16C. With such a structure, it is possible to more reliably prevent the solder from adhering to the central portions of the end surfaces where the outer electrodes 111J and 112J are defined by the component body 110. The electrode non-formation portion 140 corresponds to a "bonding limiting unit".

Even a structure in which the non-formation portions or resist films are provided on the outer electrodes to directly bond the multilayer ceramic capacitor on the circuit board allows the occurrence of the vibration sound to be significantly reduced or prevented. However, the use of the interposer having the above structure allows the occurrence of the vibration sound to be more reliably reduced or prevented and allows the float in the mounting to be reduced or prevented, thus achieving the stability of the bonding.

Although the example in which the electrode non-formation portion 140 is provided is indicated in FIGS. 16A-16C, a resist film may be provided in the corresponding area regardless of the presence of the electrode. Alternatively, a structure in which the outer electrodes are provided only on the bottom surface may be adopted. Such a structure similar to the one in FIGS. 16A-16C may be combined with any of the structures of the above preferred embodiments.

Although the example in which the multilayer ceramic capacitor is preferably used as the chip component is indicated in the above description, any of the above structures may be applied to another chip component in which similar vibration occurs.

The rectangular or substantially rectangular shape in the present invention is not limited to a rectangle and may be a square, a polygon in which the corners of the rectangle or the square are cut out, or a shape in which the corners of the rectangle or the square are formed into a curved shape.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

What is claimed is:

1. An electronic component comprising:
   a base plate including a flat-plate-shaped insulating substrate, a first upper surface electrode and a second upper surface electrode located on one main surface of the insulating substrate, and a first lower surface electrode and a second lower surface electrode located on the other main surface of the insulating substrate; and
   a chip component including a first outer electrode and a second outer electrode located on both ends in a length direction of a main body, the first outer electrode opposing the second outer electrode, the first outer electrode being mounted on the first upper surface electrode, the second outer electrode being mounted on the second upper surface electrode; wherein
   the base plate includes a plurality of connection electrodes that are located on end surfaces perpendicular or substantially perpendicular to the one main surface and the other main surface, that connects the first upper surface electrode to the first lower surface electrode, and that connects the second upper surface electrode to the second lower surface electrode;
   the first upper surface electrode is separated from the first lower surface electrode and the second upper surface electrode is separated from the second lower surface electrode at substantially a center in a width direction perpendicular or substantially perpendicular to the length direction of the main body of the chip component;
   the main body includes a top surface and a bottom surface, first and second ends in the length direction and first and second ends in the width direction;
   the first outer electrode is located on the bottom surface, one of the first and second ends in the length direction and both of the first and second ends in the width directions; and
   the second outer electrode is located on the bottom surface, the other one of the first and second ends in the length direction and both of the first and second ends in the width direction.

2. The electronic component according to claim 1, wherein the insulating substrate includes the first upper surface electrode and the first lower surface electrode provided at a position corresponding to the first outer electrode of the chip component and includes the second upper surface electrode and the second lower surface electrode provided at a position corresponding to the second outer electrode of the chip component; and the plurality of connection electrodes are located at four corners of the insulating substrate.

3. The electronic component according to claim 2, wherein cutouts are provided at the four corners of the insulating substrate, and the connection electrodes are located on inner walls of the corresponding cutouts.

4. The electronic component according to claim 3, wherein, when the chip component is mounted on the insulating substrate, at least a portion of each of the cutouts exists in an area including an outline of the chip component, viewed from a direction perpendicular or substantially perpendicular to the one main surface and the other main surface.

5. The electronic component according to claim 3, wherein each of the cutouts has an arc shape curved toward a center of the insulating substrate, viewed from the direction perpendicular or substantially perpendicular to the one main surface and the other main surface.

6. The electronic component according to claim 3, wherein, when the chip component is mounted on the insulating substrate, the insulating substrate has an outline shape smaller than an outline of the chip component, viewed from the direction perpendicular or substantially perpendicular to the one main surface and the other main surface.

7. The electronic component according to claim 1, wherein the insulating substrate directly opposes the first outer electrode and the second outer electrode in ranges including positions where perpendicular portions that are extended down from centers of end portions where the first outer electrode and the second outer electrode of the chip component are located relative to the insulating substrate intersect at right angles with the insulating substrate.

8. The electronic component according to claim 1, wherein a resist film is provided in ranges including positions where perpendicular portions that are extended down from centers of end portions where the first outer electrode and the second outer electrode of the chip component are located relative to the first upper surface electrode and the second upper surface electrode intersect at right angles with the base plate on surfaces where the chip component is mounted of the first upper surface electrode and the second upper surface electrode.

9. An electronic component comprising:
a base plate including a flat-plate-shaped insulating substrate, a first upper surface electrode and a second upper surface electrode located on one main surface of the insulating substrate, and a first lower surface electrode and a second lower surface electrode located on the other main surface of the insulating substrate; and
a chip component including a first outer electrode and a second outer electrode located on both ends in a length direction of a main body, the first outer electrode opposing the second outer electrode, the first outer electrode being mounted on the first upper surface electrode, the second outer electrode being mounted on the second upper surface electrode; wherein
the base plate includes a plurality of connection electrodes that are located on end surfaces perpendicular or substantially perpendicular to the one main surface and the other main surface, that connects the first upper surface electrode to the first lower surface electrode, and that connects the second upper surface electrode to the second lower surface electrode;
a contact limiting unit provided on the first upper surface electrode and the second upper surface electrode such that ranges including positions where perpendicular portions that are extended down from centers of end surfaces of the first outer electrode and the second outer electrode to the first upper surface electrode and the second upper surface electrode intersect at right angles with the base plate, are not in contact with the first upper surface electrode and the second upper surface electrode;
the main body includes a top surface and a bottom surface, first and second ends in the length direction and first and second ends in the width direction;
the first outer electrode is located on the bottom surface, one of the first and second ends in the length direction and both of the first and second ends in the width directions; and
the second outer electrode is located on the bottom surface, the other one of the first and second ends in the length direction and both of the first and second ends in the width direction.

10. The electronic component according to claim 9, wherein the insulating substrate includes the first upper surface electrode and the first lower surface electrode provided at a position corresponding to the first outer electrode of the chip component and includes the second upper surface electrode and the second lower surface electrode provided at a position corresponding to the second outer electrode of the chip component; and the contact limiting unit includes an open area provided with the first upper surface electrode and the second upper surface electrode.

11. The electronic component according to claim 9, wherein the insulating substrate includes the first upper surface electrode and the first lower surface electrode provided at a position corresponding to the first outer electrode of the chip component and includes the second upper surface electrode and the second lower surface electrode provided at a position corresponding to the second outer electrode of the chip component; and the contact limiting unit includes a resist film located on the first upper surface electrode and the second upper surface electrode.

12. The electronic component according to claim 9, wherein the connection electrodes are each located at substantially a center in a width direction perpendicular or substantially perpendicular to the length direction of the main body of the chip component.

13. The electronic component according to claim 9, wherein the connection electrodes are each located on an inner wall of a cutout located on an end surface portion of the insulating substrate.

14. The electronic component according to claim 13, wherein each of the cutouts has an arc shape curved toward a center of the insulating substrate, viewed from a direction perpendicular or substantially perpendicular to the one main surface and the other main surface.

15. An electronic component comprising:
a base plate including a flat-plate-shaped insulating substrate, a first upper surface electrode and a second upper surface electrode located on one main surface of the insulating substrate, and a first lower surface electrode and a second lower surface electrode located on the other main surface of the insulating substrate; and
a chip component including a first outer electrode and a second outer electrode located on both ends in a length direction of a main body, the first outer electrode opposing the second outer electrode, the first outer electrode being mounted on the first upper surface electrode, the second outer electrode being mounted on the second upper surface electrode; wherein the base plate includes a plurality of connection electrodes that are located on end surfaces perpendicular or substantially perpendicular to the one main surface and the other main surface, that connects the first upper surface electrode to the first lower surface electrode, and that connects the second upper surface electrode to the second lower surface electrode;

the connection electrodes are each located on an inner wall defining a cutout having a shape that is concave from the end surface of the insulating substrate;

a limiting unit with which the cutouts are covered in a plan view of the insulating substrate is located at a side of the first upper surface electrode and at a side of the second upper surface electrode of the cutout;

the main body includes a top surface and a bottom surface, first and second ends in the length direction and first and second ends in the width direction;

the first outer electrode is located on the bottom surface, one of the first and second ends in the length direction and both of the first and second ends in the width directions; and the second outer electrode is located on the bottom surface, the other one of the first and second ends in the length direction and both of the first and second ends in the width direction.

16. The electronic component according to claim 1, wherein a bonding limiting unit is located in a range including a center of an end surface on which the first outer electrode and the second outer electrode of the chip component are located.

17. The electronic component according to claim 16, wherein the bonding limiting unit extends over an entirety of the end surface.

18. The electronic component according to claim 1, wherein the chip component is a two-terminal multilayer ceramic capacitor.

19. The electronic component according to claim 1 wherein
   a portion of the first outer electrode on the bottom surface is opposed to the first upper surface electrode, viewed from a direction perpendicular or substantially perpendicular to the bottom surface; and
   a portion of the second outer electrode on the bottom surface is opposed to the second upper surface electrode, viewed from a direction perpendicular or substantially perpendicular to the bottom surface.

20. The electronic component according to claim 9 wherein,
   a portion the first outer electrode on the bottom surface is opposed to the first upper surface electrode, viewed from a direction perpendicular or substantially perpendicular to the bottom surface; and
   a portion of the second outer electrode on the bottom surface is opposed to the second upper surface electrode, viewed from a direction perpendicular or substantially perpendicular to the bottom surface.

* * * * *